(12) United States Patent
Mukunoki et al.

(10) Patent No.: US 10,134,718 B2
(45) Date of Patent: Nov. 20, 2018

(54) POWER SEMICONDUCTOR MODULE

(71) Applicant: Mitsubishi Electric Corporation, Chiyoda-ku (JP)

(72) Inventors: Yasushige Mukunoki, Chiyoda-ku (JP); Yoshiko Tamada, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/738,167

(22) PCT Filed: Jun. 28, 2016

(86) PCT No.: PCT/JP2016/069140
§ 371 (c)(1),
(2) Date: Dec. 20, 2017

(87) PCT Pub. No.: WO2017/006809
PCT Pub. Date: Jan. 12, 2017

(65) Prior Publication Data
US 2018/0190636 A1    Jul. 5, 2018

(30) Foreign Application Priority Data

Jul. 9, 2015    (JP) ................................. 2015-137519

(51) Int. Cl.
*H01L 25/18*    (2006.01)
*H01L 25/07*    (2006.01)
(Continued)

(52) U.S. Cl.
CPC ........ *H01L 25/18* (2013.01); *H01L 23/49811* (2013.01); *H01L 23/49838* (2013.01);
(Continued)

(58) Field of Classification Search
CPC ................. H01L 25/18; H01L 23/5386; H01L 23/49811; H01L 24/48; H01L 23/367; H01L 2224/08054
See application file for complete search history.

(56) References Cited

U.S. PATENT DOCUMENTS

| | | | | |
|---|---|---|---|---|
| 5,617,293 A | * | 4/1997 | Schulze | ................ H01L 25/112 174/16.3 |
| 7,968,988 B2 | * | 6/2011 | Nuebel | ................ H01L 25/072 257/685 |
| 2011/0062491 A1 | | 3/2011 | Nakata | |

FOREIGN PATENT DOCUMENTS

| | | |
|---|---|---|
| JP | 2005-197433 A | 7/2005 |
| JP | 5550553 B2 | 7/2014 |
| WO | 2010/004802 | 1/2010 |

OTHER PUBLICATIONS

International Search Report dated Sep. 13, 2016 in PCT/JP2016/069140 filed Jun. 28, 2016.

* cited by examiner

*Primary Examiner* — Dung Le
(74) *Attorney, Agent, or Firm* — Oblon, McClelland, Maier & Neustadt, L.L.P.

(57) ABSTRACT

A power semiconductor module including a positive-side switching device and a positive-side diode device which are mounted on a positive-side conductive pattern, and a negative-side switching device and a negative-side diode device which are mounted on an output-side conductive pattern. When an insulating substrate is viewed in plan view, the positive-side diode device and the negative-side diode device are disposed between the positive-side switching device and the negative-side switching device, and the negative-side diode device is disposed closer to the positive-side switching device than the positive-side diode device is.

8 Claims, 20 Drawing Sheets

(51) Int. Cl.
 *H02M 7/48* (2007.01)
 *H01L 23/498* (2006.01)
 *H02M 7/00* (2006.01)
 *H02M 7/5387* (2007.01)
 *H01L 23/538* (2006.01)
 *H01L 23/367* (2006.01)
 *H01L 23/00* (2006.01)

(52) U.S. Cl.
 CPC .......... *H01L 23/5386* (2013.01); *H01L 24/48* (2013.01); *H01L 25/07* (2013.01); *H02M 7/003* (2013.01); *H02M 7/48* (2013.01); *H02M 7/5387* (2013.01); *H01L 23/367* (2013.01); *H01L 24/08* (2013.01); *H01L 2224/0603* (2013.01); *H01L 2224/08054* (2013.01); *H01L 2224/08055* (2013.01); *H01L 2224/48227* (2013.01); *H01L 2224/49113* (2013.01); *H01L 2924/12031* (2013.01); *H01L 2924/1305* (2013.01); *H01L 2924/13055* (2013.01); *H01L 2924/13091* (2013.01); *H01L 2924/1425* (2013.01); *H01L 2924/30107* (2013.01)

POWER SEMICONDUCTOR MODULE

TECHNICAL FIELD

The present disclosure relates to a power semiconductor module including switching devices and diodes for power conversion.

BACKGROUND ART

In a power semiconductor module, a surge voltage is generated at the time of switching of a switching device. A surge voltage is a voltage pulse generated in a short period of time. When a surge voltage is generated, a sudden voltage change is applied to a parasitic capacitance in the power semiconductor module, thus causing a noise current. The noise current is transmitted to the entire apparatus in which the power semiconductor module is included through parasitic components in the apparatus and causes a trouble, such as a malfunction. Further, an increase in surge voltage causes an increase in loss, and subsequent heat generation at a semiconductor device. Therefore, there is a risk of thermal destruction. Implementation of a highly heat-dissipative structure for avoiding thermal destruction would lead to an increase in cost.

PTD 1 (Japanese Patent No. 5550553) discloses a power semiconductor module that can reduce a surge voltage by reducing an effective inductance of the wires. Specifically, in the power semiconductor module in this document, semiconductor devices, i.e., a negative-side diode, a positive-side switching device, a negative-side switching device, and a positive-side diode, are arrayed in this order in a row on a substrate. According to this configuration, when switching of the positive-side switching device is performed, a surge current flows in two directions, i.e., clockwise and counterclockwise directions, through the negative-side diode and the negative-side switching device on both sides of the positive-side switching device. As a result, the magnetic flux is canceled, and the effective inductance of the current path can be reduced (see paragraph 0033 of PTD 1). Similarly, when switching of the negative-side switching device is performed, a surge current flows in two directions, i.e., clockwise and counterclockwise directions, through the positive-side switching device and the positive-side diode on both sides of the negative-side switching device. As a result, and the effective inductance of the current path can be reduced.

CITATION LIST

Patent Document

PTD 1: Japanese Patent No. 5550553

SUMMARY OF INVENTION

Technical Problem

However, in the case of PTD 1 described above, the positive-side switching device and the negative-side switching device, which are the main heat generators, are disposed to be adjacent to each other in order to cancel a magnetic flux caused by a surge current. This configuration causes a serious thermal interference between the switching devices. A highly heat-dissipative design would be required to avoid such a problem, and it would lead to increases in size and cost of the power semiconductor module.

The present disclosure has been made in view of such problems. A main object of the present disclosure is to provide a power semiconductor module that can reduce a surge voltage by reducing the inductances of the bonding wires and that allows for simplification of heat-dissipation equipment.

Solution to Problem

The present disclosure is directed to a power semiconductor module including: an insulating substrate including a first principal surface and a second principal surface; a positive-side conductive pattern, a negative-side conductive pattern, and an output-side conductive pattern which are formed on the first principal surface of the insulating substrate; a positive-side power-supply terminal; a negative-side power-supply terminal; an output terminal; a positive-side switching device; a positive-side diode device; a negative-side switching device; and a negative-side diode device. The positive-side power-supply terminal is provided on the positive-side conductive pattern and is configured to receive a positive-side power-supply voltage. The negative-side power-supply terminal is provided on the negative-side conductive pattern and is configured to receive a negative-side power-supply voltage. The output terminal is provided on the output-side conductive pattern and is configured to be electrically connected to a load. The positive-side switching device includes a first principal surface having a first main electrode formed thereon, and a second principal surface having a second main electrode and a control electrode formed thereon. The first main electrode is attached to the positive-side conductive pattern, and the second main electrode is connected to the output-side conductive pattern via an electrical connecting body. The positive-side diode device includes a first principal surface having a cathode electrode formed thereon, and a second principal surface having an anode electrode formed thereon. The cathode electrode is attached to the positive-side conductive pattern, and the anode electrode is connected to the output-side conductive pattern via an electrical connecting body. The negative-side switching device includes a first principal surface having a first main electrode formed thereon, and a second principal surface having a second main electrode and a control electrode formed thereon. The first main electrode is attached to the output-side conductive pattern, and the second main electrode is connected to the negative-side conductive pattern via an electrical connecting body. The negative-side diode device includes a first principal surface having a cathode electrode formed thereon, and a second principal surface having an anode electrode formed thereon. The cathode electrode is attached to the output-side conductive pattern, and the anode electrode is connected to the negative-side conductive pattern via an electrical connecting body. When the insulating substrate is viewed in plan view, the positive-side diode device and the negative-side diode device are disposed between the positive-side switching device and the negative-side switching device, and the negative-side diode device is disposed closer to the positive-side switching device than the positive-side diode device is.

Advantageous Effects of Invention

According to the present disclosure, since the positive-side diode device and the negative-side diode device are disposed between the positive-side switching device and the negative-side switching device when the insulating substrate is viewed in plan view, a thermal interference between the switching devices, which are the main heat generators, can be lessened. Thus, heat-dissipation equipment can be simplified. Further, since the negative-side diode device is disposed closer to the positive-side switching device than the positive-side diode device is, the inductances of the bonding wires can be reduced. As a result, a surge voltage can be reduced.

BRIEF DESCRIPTION OF DRAWINGS

FIG. 2 is a diagram that shows a flow of surge current when the positive-side switching device of FIG. 1 turns on.

FIG. 3 is a diagram that shows a flow of surge current when the negative-side switching device of FIG. 1 turns on.

DESCRIPTION OF EMBODIMENTS

Figure 1:
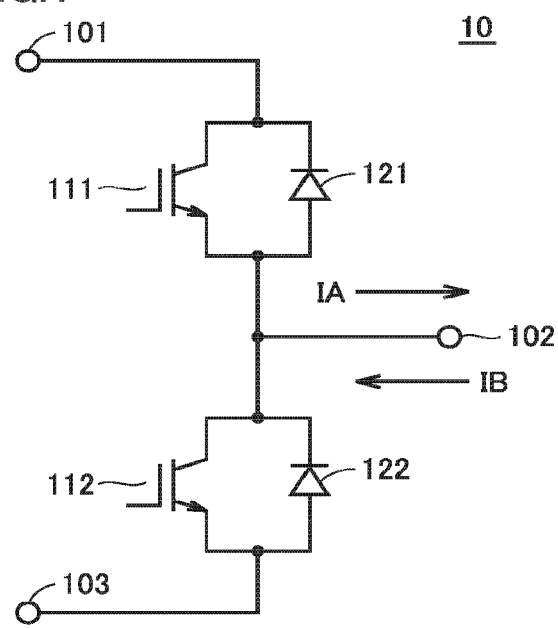
FIG. 1 is a circuit diagram that shows a configuration of a power semiconductor module according to Embodiment 1.

Embodiments are described below in detail with reference to the drawings. Identical or equivalent components are denoted in identical reference characters, and the explanations thereof will not be repeated.

Embodiment 1

[Circuit Configuration of Power Semiconductor Module]

FIG. 1 is a circuit diagram that shows a configuration of a power semiconductor module according to Embodiment 1. With reference to FIG. 1, a power semiconductor module 10 is an inverter module, which is a so-called 2-in-1 structure. The power semiconductor module 10 includes a positive-side power-supply terminal 101 to receive a positive-side power-supply voltage, an output terminal 102 to be electrically connected to a load, a negative-side power-supply terminal 103 to receive a negative-side power-supply voltage, a positive-side switching device 111, a positive-side diode device 121, a negative-side switching device 112, and a negative-side diode device 122.

In the case of FIG. 1, the positive-side switching device 111 and the negative-side switching device 112 are insulated gate bipolar transistors (IGBTs). They may be, however, other types of semiconductor switching devices, such as power metal oxide semiconductor field effect transistors (MOSFETs) and bipolar transistors, for example.

The connections between the components of FIG. 1 will now be described. The positive-side switching device 111 and the negative-side switching device 112 are connected in series in this order between the positive-side power-supply terminal 101 and the negative-side power-supply terminal 103. The positive-side diode device 121 is connected in parallel to the positive-side switching device 111 and reverse-biased. The negative-side diode device 122 is connected in parallel to the negative-side switching device 112 and reverse-biased. The connection node between the positive-side switching device 111 and the negative-side switching device 112 is connected to the output terminal 102.

The operation of the circuit of FIG. 1 will now be described in brief. In the power semiconductor module 10 of FIG. 1, the positive-side switching device 111 and the negative-side switching device 112 alternately turn on by, for example, a well-known pulse-width-modulation (PWM) signal. Thus, DC power input between the positive-side power-supply terminal 101 and the negative-side power-supply terminal 103 is converted into AC power to be output from the output terminal 102. Typically, two sets of the circuit of FIG. 1 connected in parallel with respect to a DC power supply can generate single-phase AC power, and three sets of the circuit of FIG. 1 connected in parallel can generate three-phase AC power.

A flow of current in a steady state in the circuit configuration of FIG. 1 will now be described. When the positive-side switching device 111 is in the on-state and the negative-side switching device 112 is in the off-state, a current IA flows in the direction from the positive-side power-supply terminal 101 to the output terminal 102. When the positive-side switching device 111 is in the off-state and the negative-side switching device 112 is in the on-state, a current IB flows in the direction from the output terminal 102 to the negative-side power-supply terminal 103. When the positive-side switching device 111 and the negative-side switching device 112 are both in the off-state, there are cases where current IA flows in the direction from the negative-side power-supply terminal 103 to the output terminal 102 through the negative-side diode device 122, and where current IB flows in the direction from the output terminal 102 to the positive-side power-supply terminal 101 through the positive-side diode device 121.

[Regarding Surge Current]

A flow of surge current generated in the circuit configuration of FIG. 1 will now be described.

Figure 2:
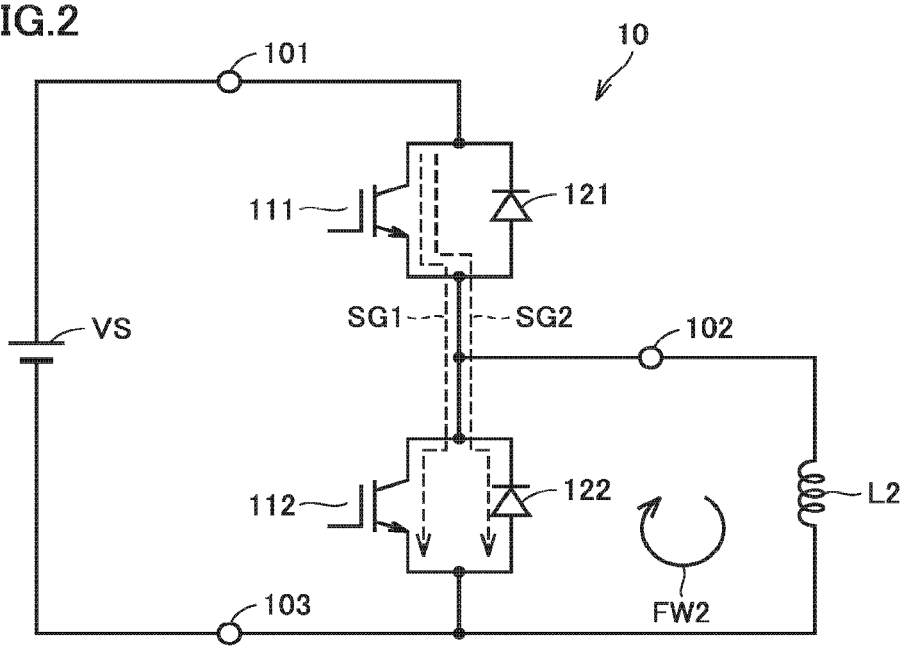

FIG. 2 is a diagram that shows a flow of surge current when the positive-side switching device of FIG. 1 turns on. FIG. 2 also shows an example of the peripheral circuit that is connected to the power semiconductor module 10. Specifically, a DC power supply VS is connected between the positive-side power-supply terminal 101 and the negative-side power-supply terminal 103, and a load inductor L2 is connected between the output terminal 102 and the negative-side power-supply terminal 103.

With reference to FIG. 2, suppose a reflux current FW2 is flowing between the load inductor L2 and the negative-side diode device 122 immediately before the positive-side switching device 111 turns on. The moment the positive-side switching device 111 turns on, the path of current changes to the one passing through the positive-side power-supply terminal 101, the positive-side switching device 111, the load inductor L2, and the negative-side power-supply terminal 103 in this order. At this time, the emitter electrode (low-potential-side electrode) of the positive-side switching device 111 (IGBT) rapidly changes from a low electrical potential to a high electrical potential, and accordingly a voltage across the negative-side switching device 112 and a voltage across the negative-side diode device 122 also rapidly change. Then, a displacement current from an output capacitance of the negative-side switching device 112 is generated as a surge current SG1, and a displacement current from a junction capacitance of the negative-side diode device 122 is generated as a surge current SG2. Surge current SG1 flows through the positive-side power-supply terminal 101, the positive-side switching device 111, the negative-side switching device 112, and the negative-side power-supply terminal 103 in this order. Surge current SG2 flows through the positive-side power-supply terminal 101, the positive-side switching device 111, the negative-side diode device 122, and the negative-side power-supply terminal 103 in this order. In the case where a positive-intrinsic-negative (PIN) diode is used as the negative-side diode device 122, a leakage current (recovery current) due to a hole storage effect is further included in surge current SG2. A value obtained by multiplying a change with respect to time of all these surge currents (di/dt) by an inductance is observed as a surge voltage. Therefore, reduction in inductance is especially important in order to reduce a surge voltage.

Figure 3:
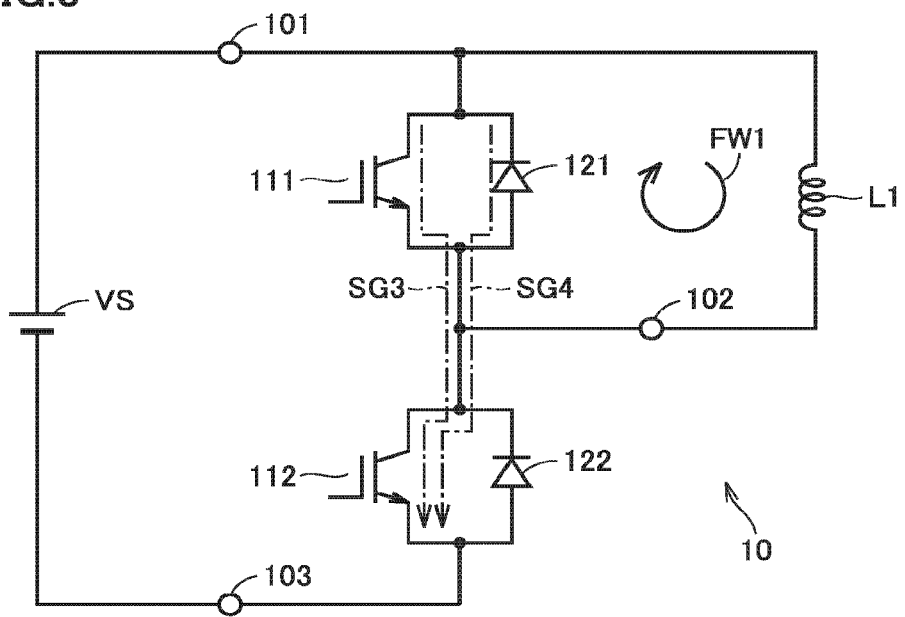

FIG. 3 is a diagram that shows a flow of surge current when the negative-side switching device of FIG. 1 turns on. FIG. 3 also shows an example of the peripheral circuit that is connected to the power semiconductor module 10. Specifically, DC power supply VS is connected between the positive-side power-supply terminal 101 and the negative-side power-supply terminal 103, and a load inductor L1 is connected between the output terminal 102 and the positive-side power-supply terminal 101.

With reference to FIG. 3, suppose a reflux current FW1 is flowing between the load inductor L1 and the positive-side diode device 121 immediately before the negative-side switching device 112 turns on. The moment the negative-side switching device 112 turns on, the path of current changes to the one passing through the positive-side power-supply terminal 101, the load inductor L1, the negative-side switching device 112, and the negative-side power-supply terminal 103 in this order. At this time, the collector electrode (high-potential-side electrode) of the negative-side switching device 112 (IGBT) rapidly changes from a high electrical potential to a low electrical potential, and accordingly a voltage across the positive-side switching device 111 and a voltage across the positive-side diode device 121 also rapidly change. Then, a displacement current from an output capacitance of the positive-side switching device 111 is generated as a surge current SG3, and a displacement current from a junction capacitance of the positive-side diode device 121 is generated as a surge current SG4. Surge current SG3 flows through the positive-side power-supply terminal 101, the positive-side switching device 111, the negative-side switching device 112, and the negative-side power-supply terminal 103 in this order. Surge current SG4 flows through the positive-side power-supply terminal 101, the positive-side diode device 121, the negative-side switching device 112, and the negative-side power-supply terminal 103 in this order. In the case where a positive-intrinsic-negative (PIN) diode is used as the positive-side diode device 121, a leakage current (recovery current) due to a hole storage effect is further included in surge current SG4. A value obtained by multiplying a change with respect to time of all these surge currents (di/dt) by an inductance is observed as a surge voltage.

[Layout of Power Semiconductor Module]

Figure 4:
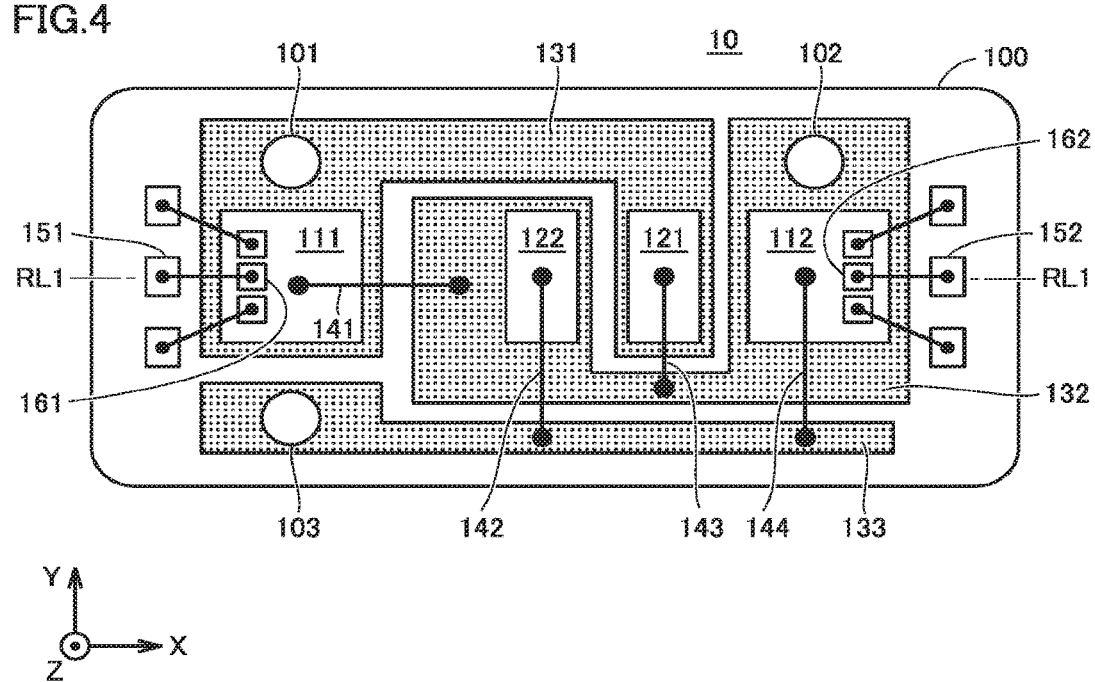
FIG. 4 is a schematic plan view that shows a layout of the power semiconductor module of FIG. 1.

FIG. 4 is a schematic plan view that shows a layout of the power semiconductor module of FIG. 1. The power semiconductor module 10 of FIG. 4 is a so-called 2-in-1 structure.

With reference to FIG. 4, the power semiconductor module 10 includes an insulating substrate 100 including a first principal surface and a second principal surface. The power semiconductor module 10 also includes a positive-side conductive pattern 131, an output-side conductive pattern 132, and a negative-side conductive pattern 133 which are formed on the first principal surface of the insulating substrate 100.

The positive-side conductive pattern 131 has the positive-side power-supply terminal 101 formed thereon to receive a positive-side power-supply voltage from outside. The output-side conductive pattern 132 has the output terminal 102 formed thereon to be connected to a load. The negative-side conductive pattern 133 has the negative-side power-supply terminal 103 formed thereon to receive a negative-side power-supply voltage. Each power-supply terminal may be directly connected to a power-supply plate with solder, or may be connected to a terminal outside of the insulating substrate 100 via a bonding wire as an electrical connecting body. The same applies to the output terminal.

As to the insulating substrate 100, an insulating substrate made of ceramic, such as aluminum nitride (AlN), may be used. Each conductive pattern is formed of, for example, a copper pattern. In the case of FIG. 4, the insulating substrate 100 has a substantially rectangular shape in plan view. However, the shape of the insulating substrate 100 in plan view is not limited as such.

The power semiconductor module 10 further includes the positive-side switching device 111, the negative-side switching device 112, the positive-side diode device 121, and the negative-side diode device 122. These semiconductor devices are discrete semiconductor devices each having a vertical structure.

Specifically, the semiconductor chip constituting the positive-side switching device 111 includes a first principal surface having a first main electrode (an emitter electrode of IGBT) formed thereon, and includes a second principal surface having a second main electrode (a collector electrode of IGBT) and a control electrode (a gate electrode of IGBT) 161 formed thereon. The first main electrode is attached to the positive-side conductive pattern 131, and the second main electrode is connected to the output-side conductive pattern 132 via a bonding wire 141. The control electrode 161 is connected, via a bonding wire, to a positive-side control terminal 151 formed on the first principal surface of the insulating substrate 100. The positive-side control terminal 151 receives, from outside, a control signal to control the positive-side switching device 111 to be ON or OFF.

The semiconductor chip constituting the negative-side switching device 112 includes a first principal surface having a first main electrode (an emitter electrode of IGBT) formed thereon, and includes a second principal surface having a second main electrode (a collector electrode of IGBT) and a control electrode (a gate electrode of IGBT) formed thereon. The first main electrode is attached to the output-side conductive pattern 132, and the second main electrode is connected to the negative-side conductive pattern 133 via a bonding wire 144. The control electrode 162 is connected, via a bonding wire, to a negative-side control terminal 152 formed on the first principal surface of the insulating substrate 100. The negative-side control terminal 152 receives, from outside, a control signal to control the negative-side switching device 112 to be ON or OFF.

The semiconductor chip constituting the positive-side diode device 121 includes a first principal surface having a cathode electrode formed thereon, and includes a second principal surface having an anode electrode formed thereon. The cathode electrode is attached to the positive-side conductive pattern 131, and the anode electrode is connected to the output-side conductive pattern 132 via a bonding wire 143.

The semiconductor chip constituting the negative-side diode device 122 includes a first principal surface having a cathode electrode formed thereon, and includes a second principal surface having an anode electrode formed thereon. The cathode electrode is attached to the output-side conductive pattern 132, and the anode electrode is connected to the negative-side conductive pattern 133 via a bonding wire 142.

[Current Flow in Steady State]

A current flow in a steady state of the power semiconductor module 10 of FIG. 4 will now be described.

When a current flows in the direction of current IA of FIG. 1 and when the positive-side switching device 111 is in the on-state (conductive state), a load current flows through the positive-side power-supply terminal 101, the positive-side conductive pattern 131, the positive-side switching device 111, the bonding wire 141, the output-side conductive pattern 132, and the output terminal 102 in this order. When the positive-side switching device is in the off-state, a reflux current flows through the negative-side power-supply terminal 103, the negative-side conductive pattern 133, the bonding wire 142, the negative-side diode device 122, the output-side conductive pattern 132, and the output terminal 102 in this order.

When a current flows in the direction of current IB of FIG. 1 and when the negative-side switching device 112 is in the on-state (conductive state), a load current flows through the output terminal 102, the output-side conductive pattern 132, the negative-side switching device 112, bonding wire 144, the negative-side conductive pattern 133, and the negative-side power-supply terminal 103 in this order. When the negative-side switching device 112 is in the off-state, a reflux current flows through the output terminal 102, the output-side conductive pattern 132, the bonding wire 143, the positive-side diode device 121, the positive-side conductive pattern 131, and the positive-side power-supply terminal 101 in this order.

[Features of Layout and Effects Thereof]

The features of the layout in FIG. 4 and effects thereof will now be described. One feature of the layout in FIG. 4 is that, when the insulating substrate 100 is viewed in plan view in the direction orthogonal to the insulating substrate 100, a part of the output-side conductive pattern 132 is disposed between a part (in particular, the mounting position of the positive-side diode device 121) of the positive-side conductive pattern 131 and a part of the negative-side conductive pattern 133.

Another feature of the layout in FIG. 4 is that, when the insulating substrate 100 is viewed in plan view, the positive-side diode device 121 and the negative-side diode device 122 are located between the positive-side switching device 111 and the negative-side switching device 112. In this case, the layout is characterized in that the negative-side diode device 122 is disposed closer to the positive-side switching device 111 than the positive-side diode device 121 is, and in that the positive-side diode device 121 is disposed closer to the negative-side switching device 112 than the negative-side diode device 122 is. In the case of FIG. 4, in particular, the positive-side diode device 121 and the negative-side diode device 122 are disposed along a reference line RL1, the reference line RL1 connecting the location of the positive-side switching device 111 (the central point of the positive-side switching device 111) and the location of the negative-side switching device 112 (the central point of the negative-side switching device 112). In other words, the positive-side switching device 111, the negative-side diode device 122, the positive-side diode device 121, and the negative-side switching device 112 are arrayed in this order in a row along the reference line RL1. Note that the reference line RL1 is used in common in this description.

Effects of the above described features will now be described. First, according to the layout in FIG. 4, since the positive-side switching device 111 and the negative-side diode device 122 are disposed to be adjacent to each other, they can be connected to each other via the shortest bonding wire 141. Similarly, since the positive-side diode device 121 and the negative-side switching device 112 are disposed to be adjacent to each other, they can be connected to each other via the shortest bonding wire 143. Since the negative-side switching device 112 and the negative-side conductive pattern 133 are adjacent to each other, they can be connected to each other via the shortest bonding wire 144. The bonding wires serve as the paths having a higher inductance than the conductive patterns. Therefore, reduction in length of the bonding wires leads to reduction in inductance of the entire path. As the result of the reduction in impedance, a surge voltage can be reduced.

Further, according to the layout in FIG. 4, the switching devices, which are the main heat generators, can be disposed at both ends of the array of the semiconductor devices. Therefore, a thermal interference between the switching devices can be lessened. As a result, heat-dissipation equipment can be simplified.

Further, in the layout in FIG. 4, control terminal 151 for the positive-side switching device 111 is adjacent to the positive-side conductive pattern 131 and is disposed opposite to the negative-side switching device 112 across the positive-side switching device 111. Similarly, control terminal 152 for the negative-side switching device 112 is adjacent to the output-side conductive pattern 132 and is disposed opposite to the positive-side switching device 111 across the negative-side switching device 112.

According to the above described locations of the control terminals, the bonding wire that connects the positive-side control terminal 151 with the control electrode 161 of the positive-side switching device 111 does not pass over the output-side conductive pattern 132 and the negative-side conductive pattern 133. As a result, influences of a main current flowing through conductive patterns 132, 133 can be reduced, and thus the risk of malfunction of the positive-side switching device 111 can be reduced. Similarly, the bonding wire that connects the negative-side control terminal 152 with the control electrode 162 of the negative-side switching device 112 does not pass over the positive-side conductive pattern 131 and the negative-side conductive pattern 133. As a result, influences of a main current flowing through conductive patterns 131, 133 can be reduced, and thus the risk of malfunction of the negative-side switching device 112 can be reduced.

Further, according to the layout in FIG. 4, since the positive-side switching device 111 and the negative-side diode device 122 are disposed to be adjacent to each other, the path of surge current passing through these semiconductor devices can be shortened in length. Concrete explanations are given below with reference to FIG. 5.

Figure 5:
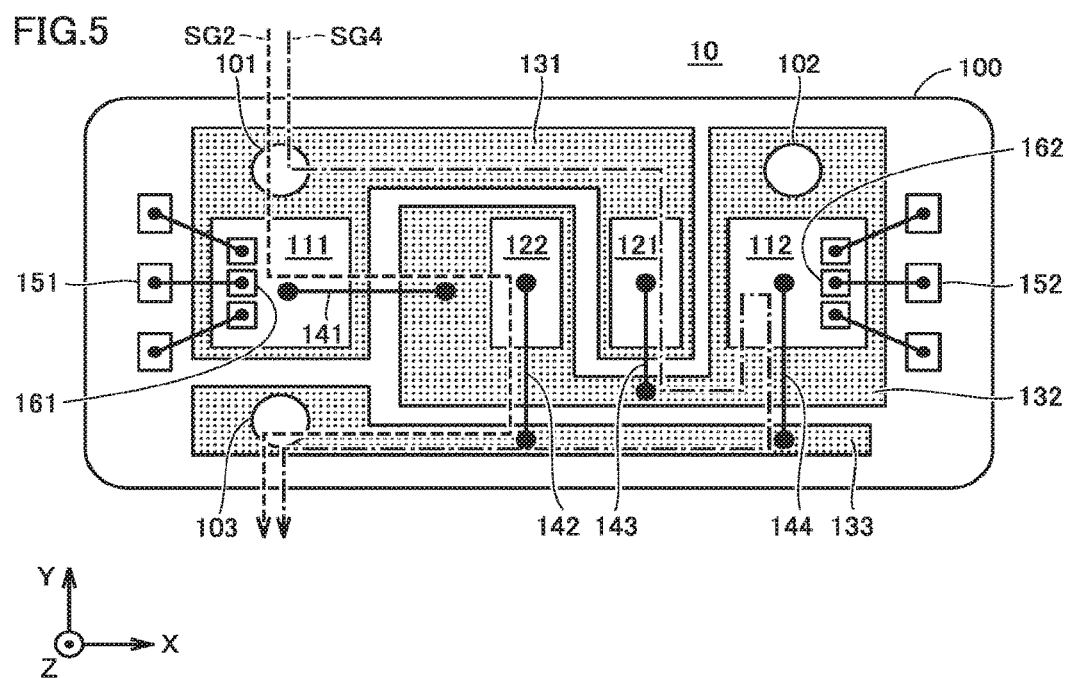
FIG. 5 is a diagram that shows the paths of surge currents in the power semiconductor module of FIG. 4.

FIG. 5 is a diagram that shows the paths of surge currents in the power semiconductor module of FIG. 4. In FIG. 5, the path of surge current SG2 of FIG. 2 is indicated by a broken line, and the path of surge current SG4 of FIG. 3 is indicated by a dot-and-dash line. As shown in FIG. 5, by placing the positive-side switching device 111 and the negative-side diode device 122 to be adjacent to each other, the path length of surge current SG2 flowing through the positive-side power-supply terminal 101, the positive-side switching device 111, the negative-side diode device 122, and the negative-side power-supply terminal 103 in this order can be shortened. As a result, a surge voltage can be reduced.

Figure 16:
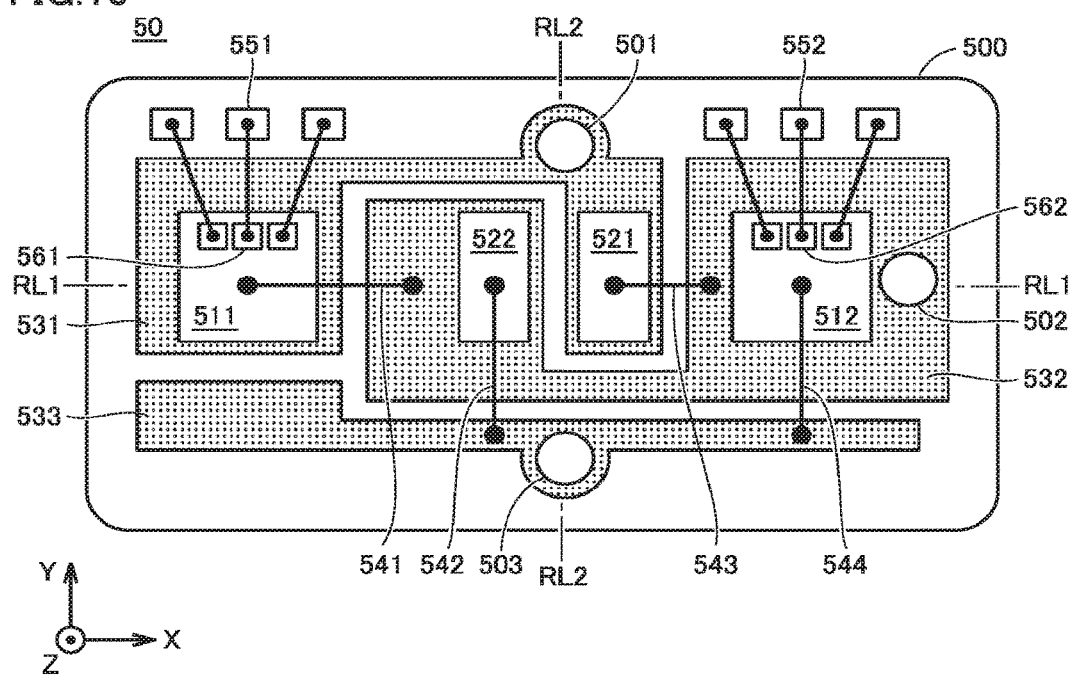
FIG. 16 is a schematic plan view that shows a layout of a power semiconductor module according to Embodiment 5.
Figure 17:
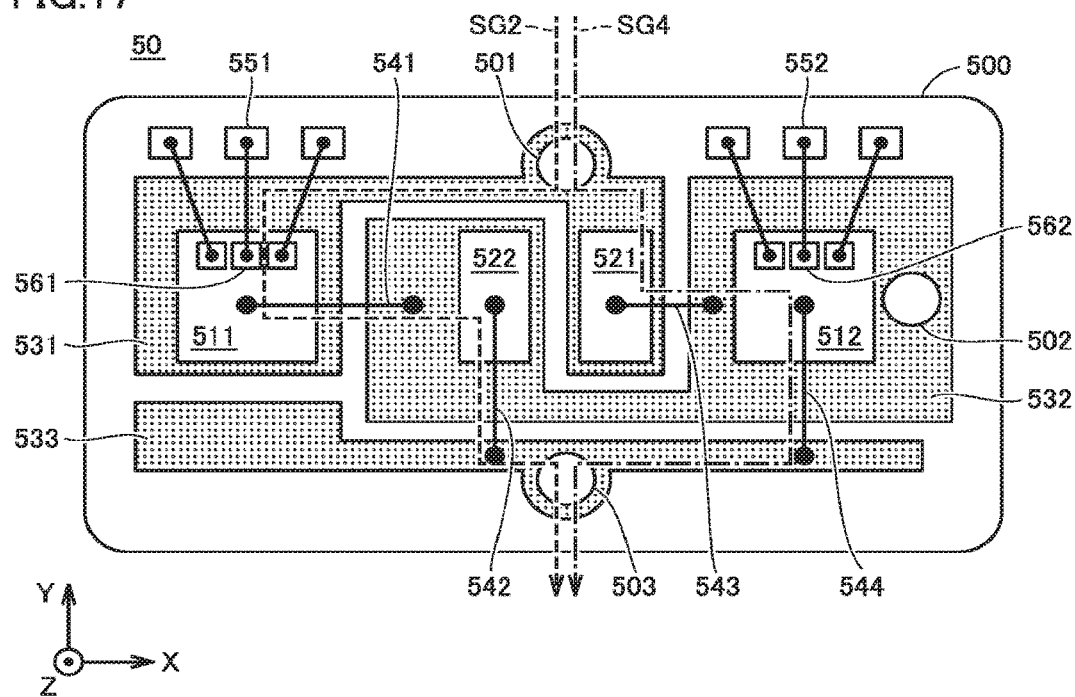
FIG. 17 is a diagram that shows the paths of surge currents in the power semiconductor module of FIG. 16.

The path length of surge current SG4 flowing through the positive-side power-supply terminal 101, the positive-side diode device 121, the negative-side switching device 112, and the negative-side power-supply terminal 103 in this order can also be shortened with ingenious locations of the conductive patterns and the power-supply terminals. As to such cases, explanations will be given with reference to Embodiment 2 (FIGS. 7 to 10) and Embodiment 5 (FIGS. 16 and 17).

As described above, the power semiconductor module 10 of Embodiment 1 allows for reduction in the inductance of the bonding wire, simplification of heat-dissipation equipment, and reduction in risk of malfunction. As a result, a power semiconductor module with enhanced reliability and reduced size can be provided.

<Modification of Embodiment 1>

Figure 6:
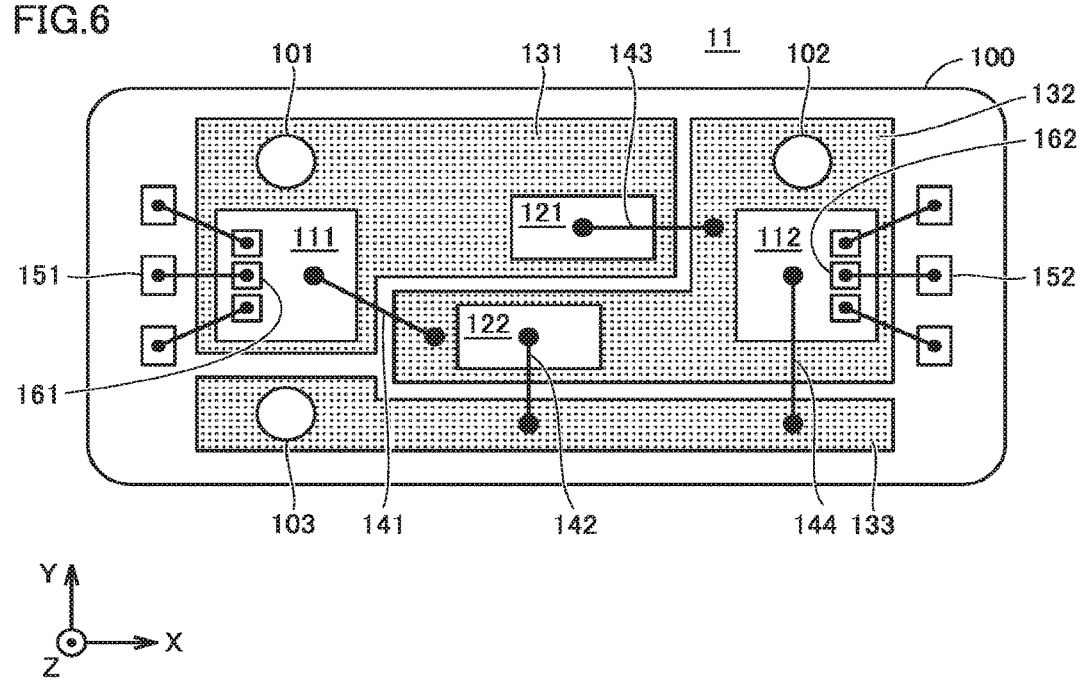
FIG. 6 is a schematic plan view that shows a layout of Modification of the power semiconductor module of FIG. 4.

FIG. 6 is a schematic plan view that shows a layout of Modification of the power semiconductor module of FIG. 4. A power semiconductor module 11 of FIG. 6 is different from the case of FIG. 4 in arrangement of the positive-side diode device 121 and the negative-side diode device 122. Specifically, the case of FIG. 6 is characterized in that the positive-side switching device 111, the negative-side diode device 122, the positive-side diode device 121, and the negative-side switching device 112 are arrayed not substantially in a row, so that the semiconductor devices are disposed closer to each other. Thus, the power semiconductor module can be further downsized.

Note that the case of FIG. 6 is the same as that of FIG. 4 in that the positive-side diode device 121 and the negative-side diode device 122 are disposed between the positive-side switching device 111 and the negative-side switching device 112. Further, the case of FIG. 6 is also the same as that of FIG. 4 in that the negative-side diode device 122 is disposed closer to the positive-side switching device 111 than the positive-side diode device 121 is, and in that the positive-side diode device 121 is disposed closer to the negative-side switching device 112 than the negative-side diode device 122 is. Therefore, the power semiconductor module 11 of FIG. 6 has substantially the same effects as those of the power semiconductor module 10 of FIG. 4. The other features of FIG. 6 are the same as those of FIG. 4. Thus, identical or corresponding components are denoted in identical reference characters and the explanations thereof will not be repeated.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

Embodiment 2

Figure 7:
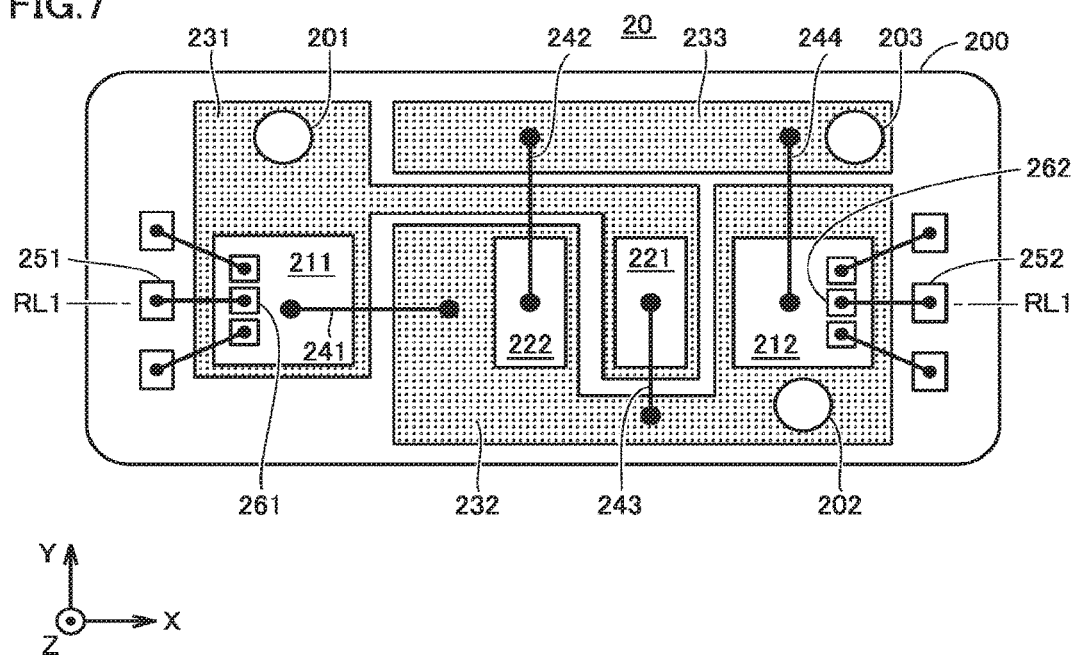
FIG. 7 is a schematic plan view that shows a layout of a power semiconductor module according to Embodiment 2.

FIG. 7 is a schematic plan view that shows a layout of a power semiconductor module according to Embodiment 2.

A power semiconductor module 20 of FIG. 7 is a modification of the power semiconductor module 10 of FIG. 4. Specifically, an insulating substrate 200, a positive-side power-supply terminal 201, an output terminal 202, and a negative-side power-supply terminal 203 of FIG. 7 respectively correspond to the insulating substrate 100, the positive-side power-supply terminal 101, the output terminal 102, and the negative-side power-supply terminal 103 of FIG. 4. A positive-side switching device 211, a negative-side switching device 212, a positive-side diode device 221, and a negative-side diode device 222 of FIG. 7 respectively correspond to the positive-side switching device 111, the negative-side switching device 112, the positive-side diode device 121, and the negative-side diode device 122 of FIG. 4. A positive-side conductive pattern 231, an output-side conductive pattern 232, a negative-side conductive pattern 233, and bonding wires 241-244 as electrical connecting bodies of FIG. 7 respectively correspond to the positive-side conductive pattern 131, the output-side conductive pattern 132, the negative-side conductive pattern 133, and the bonding wires 141-144 of FIG. 4. A control electrode 261 of the positive-side switching device 211 and a control electrode 262 of the negative-side switching device 212 of FIG. 7 respectively correspond to the control electrode 161 of the positive-side switching device 111 and the control electrode 162 of the negative-side switching device 112 of FIG. 4. The corresponding elements are similar in function and configuration, and thus the explanations thereof will not be repeated below.

The power semiconductor module 20 of FIG. 7 is different from the semiconductor module of FIG. 4 in arrangement of the conductive patterns, the power-supply terminals, and the output terminal. Specifically, the case of FIG. 7 is characterized in that, when the insulating substrate 200 is viewed in plan view, a part of the positive-side conductive pattern 231 is disposed between a part (in particular, the mounting position of the negative-side diode device 222) of the output-side conductive pattern 232 and a part of the negative-side conductive pattern 233.

Further, in the case of FIG. 4, the negative-side power-supply terminal 103 is disposed to be adjacent to the positive-side switching device 111, whereas in the case of FIG. 7, the negative-side power-supply terminal 203 is disposed to be adjacent to the negative-side switching device 212. Power-supply terminals 201, 203 and the output terminal 202 of FIG. 7 are disposed as follows in more general terms. That is, when the insulating substrate 200 is viewed in plan view, the positive-side power-supply terminal 201 and the negative-side power-supply terminal 203 are disposed on the side opposite to the output terminal 202 with respect to the reference line RL1. The positive-side power-supply terminal 201 is disposed to be adjacent to the positive-side switching device 211 and to be remoter from the reference line RL1 than the positive-side switching device 211 is. The negative-side power-supply terminal 203 is disposed to be adjacent to the negative-side switching device 212 and to be remoter from the reference line RL1 than the negative-side switching device 212 is.

According to the above described configuration, the path length (the inductance of the bonding wire) of surge current SG2 at the time of turn-on of the positive-side switching device 211 and the path length (the inductance of the bonding wire) of surge current SG4 at the time of turn-on of the negative-side switching device 212 can be advantageously shortened to an equal extent. Concrete explanations are given below with reference to the paths of surge currents illustrated.

Figure 8:
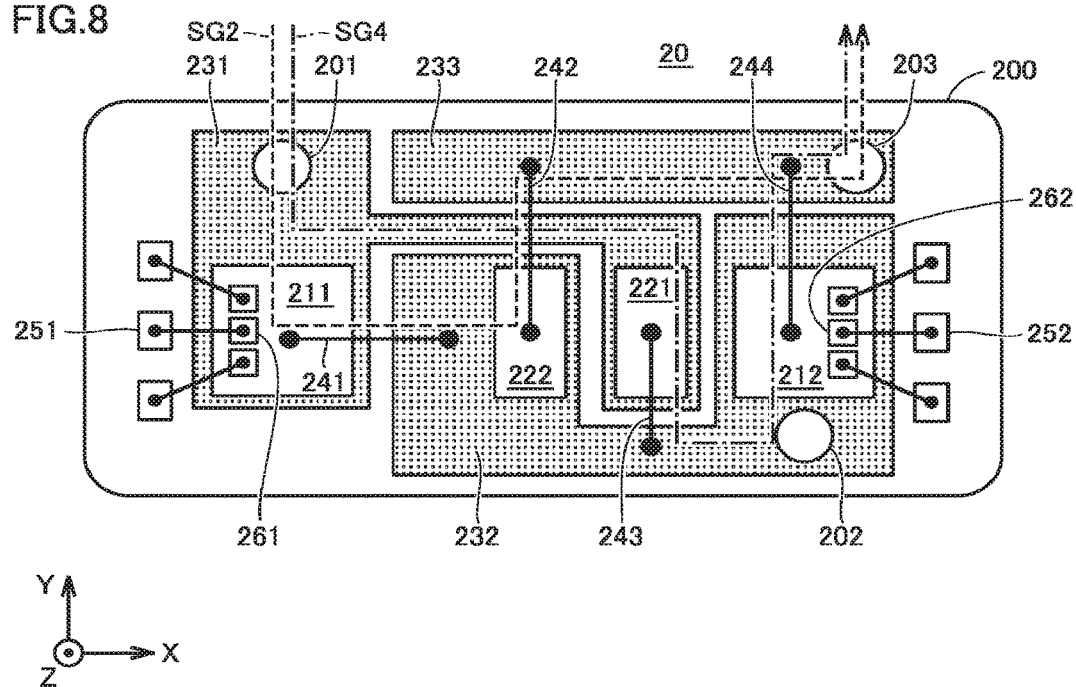
FIG. 8 is a diagram that shows the paths of surge currents in the power semiconductor module of FIG. 7.

FIG. 8 is a diagram that shows the paths of surge currents in the power semiconductor module of FIG. 7. In FIG. 8, the path of surge current SG2 of FIG. 2 is indicated by a broken line, and the path of surge current SG4 of FIG. 3 is indicated by a dot-and-dash line.

As shown in FIG. 8, by placing the positive-side switching device 211 and the negative-side diode device 222 to be adjacent to each other, the path length of surge current SG2 flowing through the positive-side power-supply terminal 201, the positive-side switching device 211, the negative-side diode device 222, and the negative-side power-supply terminal 203 in this order can be shortened. Similarly, by placing the positive-side diode device 221 and the negative-side switching device 212 to be adjacent to each other, the path length of surge current SG4 flowing through the positive-side power-supply terminal 201, the positive-side diode device 221, the negative-side switching device 212, and the negative-side power-supply terminal 203 in this order can be shortened. Further, as shown in FIG. 8, the path length of surge current SG2 and the path length of surge current SG4 are substantially equal to each other. As a result, a surge voltage at the time of turn-on of the positive-side switching device 211 and a surge voltage at the time of turn-on of the negative-side switching device 212 can be reduced to an equal extent.

In general, heat-dissipation equipment is designed to sufficiently cool a higher-temperature device (larger-loss device), and thus the highest-temperature device (largest-loss device) is a constraint. If there are variations in loss depending on the device, heat-dissipation equipment would provide excessive heat dissipation to a small-loss device. By reducing a surge voltage at the time of turn-on of the positive-side switching device 211 and a surge voltage at the time of turn-on of the negative-side switching device 212 to an equal extent as described above, the losses of the semiconductor switching devices can be equalized and the losses of the diode devices can also be equalized. Therefore, heat-dissipation equipment can be simplified.

Further, a magnitude of noise current is generally determined by a product of a magnitude of floating capacitance and a temporal differentiation of surge voltage. Accordingly, equalization of reductions in surge voltage to be generated leads to equalization of reductions in magnitude of noise current, and thus equipment with excessive reduction in noise can be prevented.

The other effects of FIG. 7 are similar to those of FIG. 4, and thus are summarized as below in brief.

First, since the positive-side switching device 211 and the negative-side diode device 222 are disposed to be adjacent to each other, they can be connected to each other via the shortest bonding wire 241. Since the positive-side diode device 221 and the negative-side switching device 212 are disposed to be adjacent to each other, they can be connected to each other via the shortest bonding wire 243. Since the negative-side switching device 212 and the negative-side conductive pattern 233 are adjacent to each other, they can be connected to each other via the shortest bonding wire 244. Accordingly, reduction in impedance can be achieved, and thus a surge voltage can be reduced.

Since the switching devices, which are the main heat generators, can be disposed at both ends of the array of the semiconductor devices, a thermal interference between the switching devices can be lessened. As a result, heat-dissipation equipment can be simplified.

The bonding wire that connects a positive-side control terminal 251 with the control electrode 261 of the positive-side switching device 211 does not pass over the output-side conductive pattern 232 and the negative-side conductive pattern 233. Similarly, the bonding wire that connects a negative-side control terminal 252 with the control electrode 262 of the negative-side switching device 212 does not pass over the positive-side conductive pattern 231 and the negative-side conductive pattern 233. As a result, the risk of malfunction of the positive-side switching device 211 and the negative-side switching device 212 can be reduced.

As described above, according to the present embodiment, a power semiconductor module can be provided that achieves low inductance, simplification of heat-dissipation equipment, reduction in noise, and reduction in risk of malfunction.

<Modification 1 of Embodiment 2>

Figure 9:
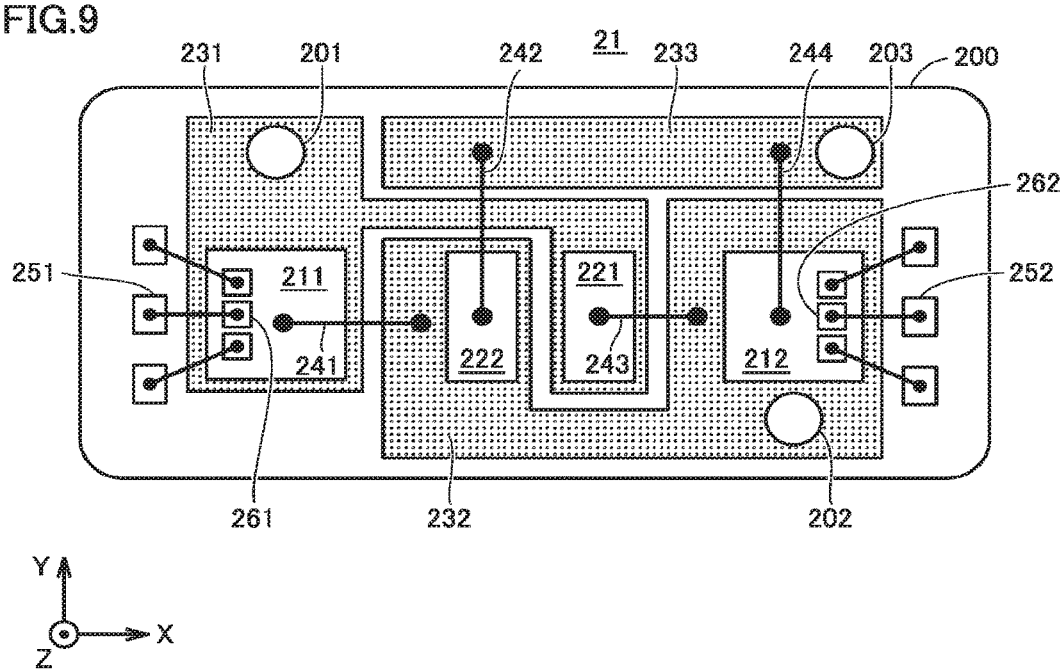
FIG. 9 is a schematic plan view that shows a layout of Modification 1 of the power semiconductor module of FIG. 7.

FIG. 9 is a schematic plan view that shows a layout of Modification 1 of the power semiconductor module of FIG. 7. A power semiconductor module 21 of FIG. 9 is different from the power semiconductor module 20 of FIG. 7 in arrangement of the bonding wire 243. Specifically, in the case of FIG. 9, the bonding wire 243 is arranged in the direction parallel to the bonding wire 241 (the direction along the reference line RL1 of FIG. 7). This can more reliably equalize the path length of surge current SG2 and the path length of surge current SG4 as described above with reference to FIG. 8. As a result, a surge voltage at the time of turn-on of the positive-side switching device 211 and a surge voltage at the time of turn-on of the negative-side switching device 212 can be equally reduced more reliably.

<Modification 2 of Embodiment 2>

Figure 10:
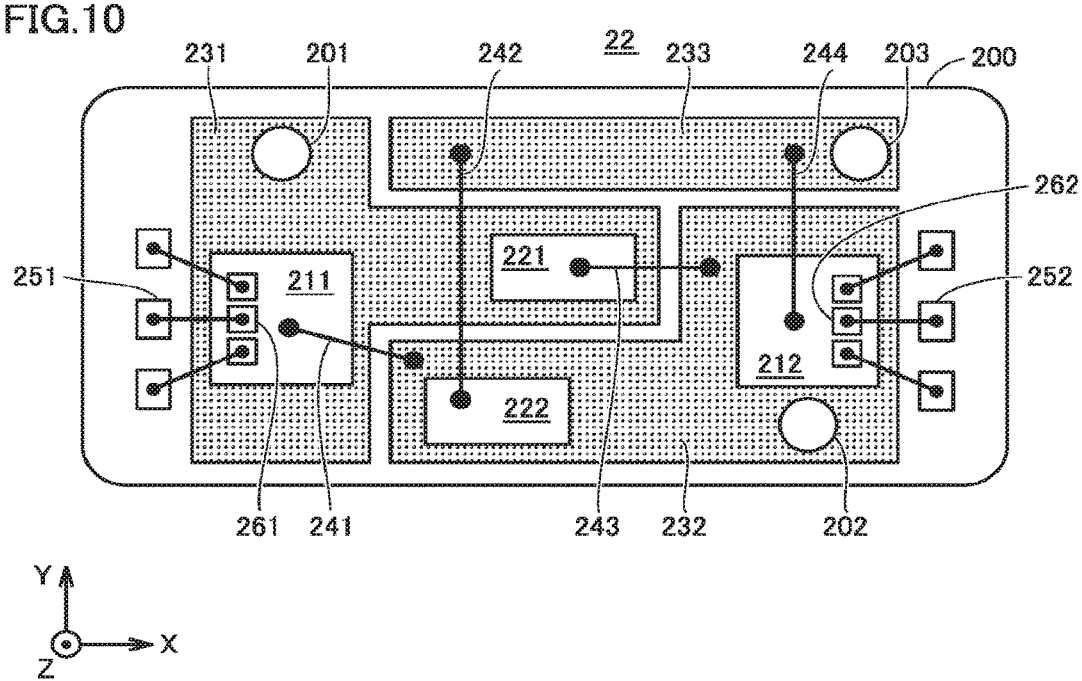
FIG. 10 is a schematic plan view that shows a layout of Modification 2 of the power semiconductor module of FIG. 7.

FIG. 10 is a schematic plan view that shows a layout of Modification 2 of the power semiconductor module of FIG. 7. A power semiconductor module 22 of FIG. 10 is characterized in that the positive-side switching device 211, the negative-side diode device 222, the positive-side diode device 221, and the negative-side switching device 212 are arrayed not substantially in a row, so that the semiconductor devices are disposed closer to each other. Thus, the power semiconductor module can be further downsized.

Note that the case of FIG. 10 is the same as that of FIG. 7 in that the positive-side diode device 221 and the negative-side diode device 222 are disposed between the positive-side switching device 211 and the negative-side switching device 212. Further, the case of FIG. 10 is also the same as that of FIG. 7 in that the negative-side diode device 222 is disposed closer to the positive-side switching device 211 than the positive-side diode device 221 is, and in that the positive-side diode device 221 is disposed closer to the negative-side switching device 212 than the negative-side diode device 222 is. Therefore, the power semiconductor module 22 of FIG. 10 has substantially the same effects as those of the power semiconductor module 20 of FIG. 7.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

Embodiment 3

Figure 11:
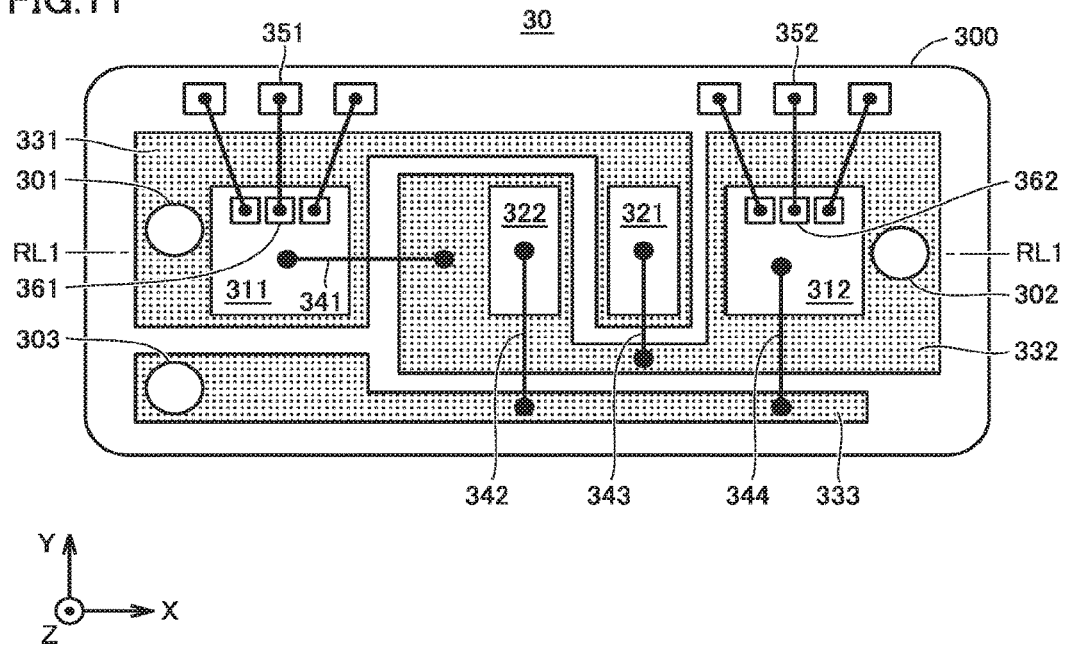
FIG. 11 is a schematic plan view that shows a layout of a power semiconductor module according to Embodiment 3.

FIG. 11 is a schematic plan view that shows a layout of a power semiconductor module according to Embodiment 3.

A power semiconductor module 30 of FIG. 11 is a modification of the power semiconductor module 10 of FIG. 4. Specifically, an insulating substrate 300, a positive-side power-supply terminal 301, an output terminal 302, and a negative-side power-supply terminal 303 of FIG. 11 respectively correspond to the insulating substrate 100, the positive-side power-supply terminal 101, the output terminal 102, and the negative-side power-supply terminal 103 of FIG. 4. A positive-side switching device 311, a negative-side switching device 312, a positive-side diode device 321, and a negative-side diode device 322 of FIG. 11 respectively correspond to the positive-side switching device 111, the negative-side switching device 112, the positive-side diode device 121, and the negative-side diode device 122 of FIG. 4. A positive-side conductive pattern 331, an output-side conductive pattern 332, a negative-side conductive pattern 333, and bonding wires 341-344 as electrical connecting bodies of FIG. 11 respectively correspond to the positive-side conductive pattern 131, the output-side conductive pattern 132, the negative-side conductive pattern 133, and the bonding wires 141-144 of FIG. 4. A control electrode 361 of the positive-side switching device 311 and a control electrode 362 of the negative-side switching device 312 of FIG. 11 respectively correspond to the control electrode 161 of the positive-side switching device 111 and the control electrode 162 of the negative-side switching device 112 of FIG. 4. The corresponding elements are similar in function and configuration, and thus the explanations thereof will not be repeated below.

The power semiconductor module 30 of FIG. 11 is different from the semiconductor module of FIG. 4 in arrangement of control terminals 351, 352 and in arrangement of the positive-side power-supply terminal 301 and the output terminal 302.

Specifically, in the layout in FIG. 11, when the insulating substrate 300 is viewed in plan view, the positive-side control terminal 351 and the negative-side control terminal 352 are disposed on the same side with respect to the reference line RL1. Further, the positive-side control terminal 351 is disposed to be adjacent to the positive-side conductive pattern 331 and to be remoter from the reference line RL1 than the positive-side conductive pattern 331 is. The negative-side control terminal 352 is disposed to be adjacent to the output-side conductive pattern 332 and to be remoter from the reference line RL1 than the output-side conductive pattern 332 is. That is, the positive-side control terminal 351 and the negative-side control terminal 352 are disposed along one side of the insulating substrate 300. Thus, the entire power semiconductor module can be downsized.

Further, in the layout in FIG. 11, when the insulating substrate 300 is viewed in plan view, the output terminal 302 is disposed opposite to the positive-side switching device 311 across the negative-side switching device 312. The positive-side power-supply terminal 301 is disposed opposite to the negative-side switching device 312 across the positive-side switching device 311. The negative-side power-supply terminal 303 is disposed to be adjacent to the positive-side power-supply terminal 301 and to be remoter from the output terminal 302 than the positive-side switching device 311 is. In other words, the positive-side power-supply terminal 301 and the negative-side power-supply terminal 303 are disposed at one end of the insulating substrate 300 in the longitudinal direction, and the output terminal 302 is disposed at the other end of the insulating substrate 300 in the longitudinal direction. According to such an arrangement, an inductance between the positive-side power-supply terminal 301 and the output terminal 302 can be equalized with an inductance between the negative-side power-supply terminal 303 and the output terminal 302.

The other effects of FIG. 11 are similar to those of FIG. 4, and thus are summarized as below in brief.

First, since the positive-side switching device 311 and the negative-side diode device 322 are disposed to be adjacent to each other, they can be connected to each other via the shortest bonding wire 341. Since the positive-side diode device 321 and the negative-side switching device 312 are disposed to be adjacent to each other, they can be connected to each other via the shortest bonding wire 343. Since the negative-side switching device 312 and the negative-side conductive pattern 333 are adjacent to each other, they can be connected to each other via the shortest bonding wire 344. Accordingly, reduction in impedance can be achieved, and thus a surge voltage can be reduced.

Since the switching devices, which are the main heat generators, can be disposed at both ends of the array of the semiconductor devices, a thermal interference between the switching devices can be lessened. As a result, heat-dissipation equipment can be simplified.

The bonding wire that connects the positive-side control terminal 351 with the control electrode 361 of the positive-side switching device 311 does not pass over the output-side conductive pattern 332 and the negative-side conductive pattern 333. Similarly, the bonding wire that connects the negative-side control terminal 352 with the control electrode 362 of the negative-side switching device 312 does not pass over the positive-side conductive pattern 331 and the negative-side conductive pattern 333. As a result, the risk of malfunction of the positive-side switching device 311 and the negative-side switching device 312 can be reduced.

As described above, according to the present embodiment, a power semiconductor module can be provided that achieves low inductance, simplification of heat-dissipation equipment, and reduction in risk of malfunction, and whose inductances from the power-supply terminals to the output terminal are equalized.

<Modification of Embodiment 3>

Figure 12:
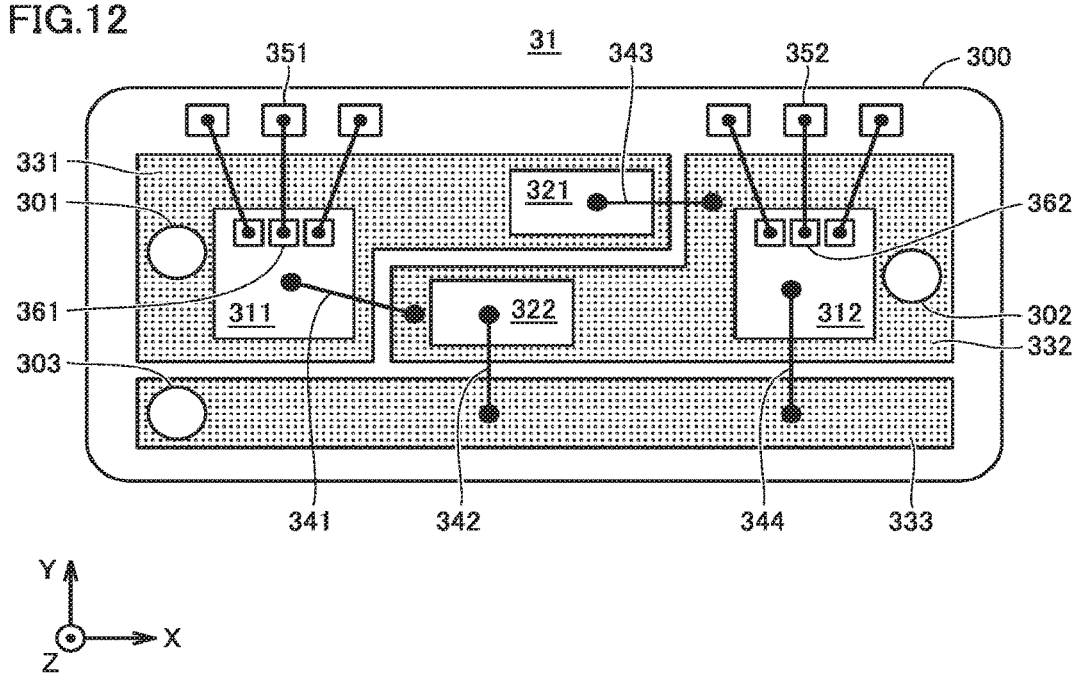
FIG. 12 is a schematic plan view that shows a layout of Modification of the power semiconductor module of FIG. 11.

FIG. 12 is a schematic plan view that shows a layout of Modification of the power semiconductor module of FIG. 11. A power semiconductor module 31 of FIG. 12 is characterized in that the positive-side switching device 311, the negative-side diode device 322, the positive-side diode device 321, and the negative-side switching device 312 are arrayed not substantially in a row, so that the semiconductor devices are disposed closer to each other. Thus, the power semiconductor module can be further downsized.

Note that the case of FIG. 12 is the same as that of FIG. 11 in that the positive-side diode device 321 and the negative-side diode device 322 are disposed between the positive-side switching device 311 and the negative-side switching device 312. Further, the case of FIG. 12 is also the same as that of FIG. 11 in that the negative-side diode device 322 is disposed closer to the positive-side switching device 311 than the positive-side diode device 321 is, and in that the positive-side diode device 321 is disposed closer to the negative-side switching device 312 than the negative-side diode device 322 is. Therefore, the power semiconductor module 31 of FIG. 12 has substantially the same effects as those of the power semiconductor module 30 of FIG. 11.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

Embodiment 4

Figure 13:
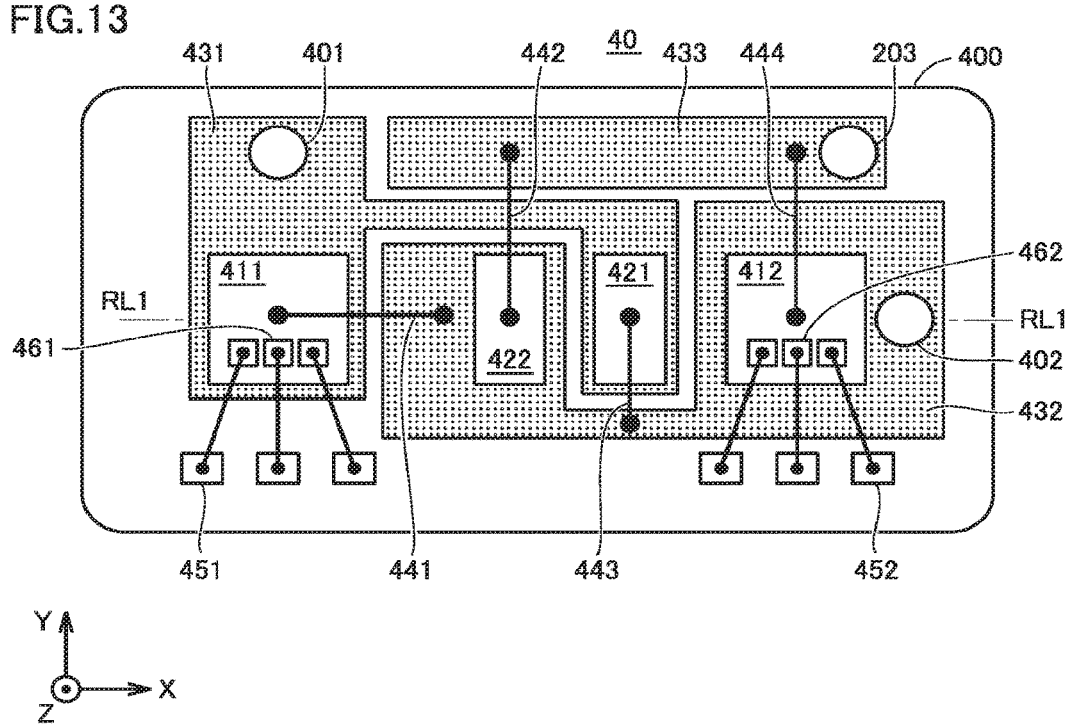
FIG. 13 is a schematic plan view that shows a layout of a power semiconductor module according to Embodiment 4.

FIG. 13 is a schematic plan view that shows a layout of a power semiconductor module according to Embodiment 4.

A power semiconductor module 40 of FIG. 13 is a modification of the power semiconductor module 20 of FIG. 7. Specifically, an insulating substrate 400, a positive-side power-supply terminal 401, an output terminal 402, and a negative-side power-supply terminal 403 of FIG. 13 respectively correspond to the insulating substrate 200, the positive-side power-supply terminal 201, the output terminal 202, and the negative-side power-supply terminal 203 of FIG. 7. A positive-side switching device 411, a negative-side switching device 412, a positive-side diode device 421, and a negative-side diode device 422 of FIG. 13 respectively correspond to the positive-side switching device 211, the negative-side switching device 212, the positive-side diode device 221, and the negative-side diode device 222 of FIG. 7. A positive-side conductive pattern 431, an output-side conductive pattern 432, a negative-side conductive pattern 433, and bonding wires 441-444 as electrical connecting bodies of FIG. 13 respectively correspond to the positive-side conductive pattern 231, the output-side conductive pattern 232, the negative-side conductive pattern 233, and the bonding wires 241-244 of FIG. 7. A control electrode 461 of the positive-side switching device 411 and a control electrode 462 of the negative-side switching device 412 of FIG. 13 respectively correspond to the control electrode 261 of the positive-side switching device 211 and the control electrode 262 of the negative-side switching device 212 of FIG. 7. The corresponding elements are similar in function and configuration, and thus the explanations thereof will not be repeated below.

The power semiconductor module 40 of FIG. 13 is different from the power semiconductor module 20 of FIG. 7 in arrangement of control terminals 451,452. Specifically, in the layout in FIG. 13, when the insulating substrate 400 is viewed in plan view, the positive-side control terminal 451 and the negative-side control terminal 452 are disposed on the same side with respect to the reference line RL1. Further, the positive-side control terminal 451 is disposed to be adjacent to the positive-side conductive pattern 431 and to be remoter from the reference line RL1 than the positive-side conductive pattern 431 is. The negative-side control terminal 452 is disposed to be adjacent to the output-side conductive pattern 432 and to be remoter from the reference line RL1 than the output-side conductive pattern 432 is. That is, the positive-side control terminal 451 and the negative-side control terminal 452 are disposed along one side of the insulating substrate 400. Thus, the entire power semiconductor module can be downsized.

The other effects of FIG. 13 are similar to those of FIG. 7, and thus are summarized as below in brief.

First, since the positive-side switching device 411 and the negative-side diode device 422 are disposed to be adjacent to each other, they can be connected to each other via the shortest bonding wire 441. Since the positive-side diode device 421 and the negative-side switching device 412 are disposed to be adjacent to each other, they can be connected to each other via the shortest bonding wire 443. Since the negative-side switching device 412 and the negative-side conductive pattern 433 are adjacent to each other, they can be connected to each other via the shortest bonding wire 444. Accordingly, reduction in impedance can be achieved, and thus a surge voltage can be reduced.

Since the switching devices, which are the main heat generators, can be disposed at both ends of the array of the semiconductor devices, a thermal interference between the switching devices can be lessened. As a result, heat-dissipation equipment can be simplified.

The bonding wire that connects the positive-side control terminal 451 with the control electrode 461 of the positive-side switching device 411 does not pass over the output-side conductive pattern 432 and the negative-side conductive pattern 433. Similarly, the bonding wire that connects the negative-side control terminal 452 with the control electrode 462 of the negative-side switching device 412 does not pass over the positive-side conductive pattern 431 and the negative-side conductive pattern 433. As a result, the risk of malfunction of the positive-side switching device 411 and the negative-side switching device 412 can be reduced.

The path length (the inductance of the bonding wire) of surge current SG2 at the time of turn-on of the positive-side switching device 411 and the path length (the inductance of the bonding wire) of surge current SG4 at the time of turn-on of the negative-side switching device 412 can be shortened to an equal extent. Therefore, heat-dissipation equipment can be simplified and reduction in noise can be achieved.

As described above, according to the present embodiment, a power semiconductor module can be provided that achieves low inductance, simplification of heat-dissipation equipment, reduction in noise, reduction in risk of malfunction, and downsizing.

<Modification 1 of Embodiment 4>

Figure 14:
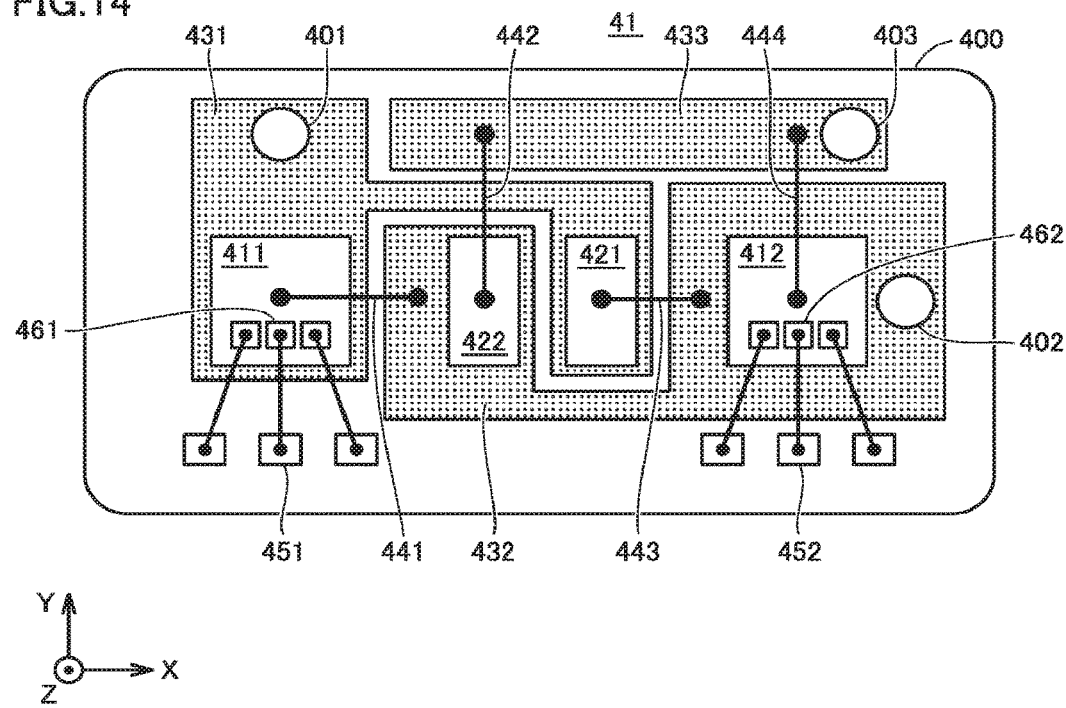
FIG. 14 is a schematic plan view that shows a layout of Modification 1 of the power semiconductor module of FIG. 13.

FIG. 14 is a schematic plan view that shows a layout of Modification 1 of the power semiconductor module of FIG. 13. A power semiconductor module 41 of FIG. 14 is different from the power semiconductor module 40 of FIG. 13 in arrangement of the bonding wire 443. Specifically, in the case of FIG. 14, the bonding wire 443 is arranged in the direction parallel to the bonding wire 441 (the direction along the reference line RL1 of FIG. 13). Thus, compared to the case of FIG. 13, the path length of surge current flowing through the positive-side power-supply terminal 401, the positive-side switching device 411, the negative-side diode device 422, and the negative-side power-supply terminal 403 in this order (corresponding to SG2 of FIG. 8) can be more reliably equalized with the path length of surge current flowing through the positive-side power-supply terminal 401, the positive-side diode device 421, the negative-side switching device 412, and the negative-side power-supply terminal 403 in this order (corresponding to SG4 of FIG. 8). As a result, a surge voltage at the time of turn-on of the positive-side switching device 411 and a surge voltage at the time of turn-on of the negative-side switching device 412 can be equally reduced more reliably.

<Modification 2 of Embodiment 4>

Figure 15:
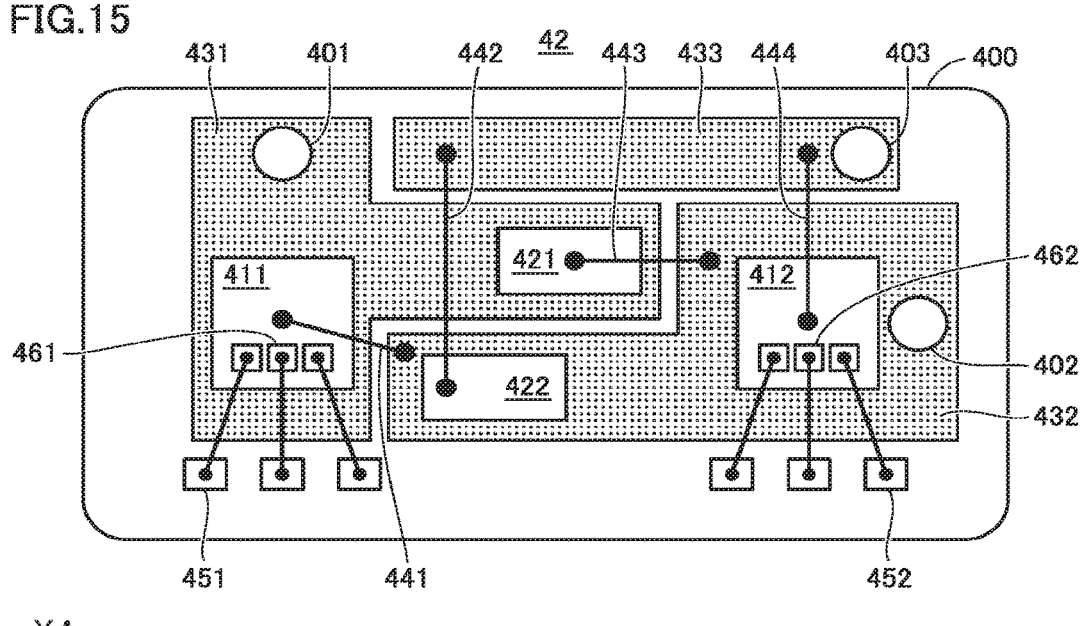
FIG. 15 is a schematic plan view that shows a layout of Modification 2 of the power semiconductor module of FIG. 13.

FIG. 15 is a schematic plan view that shows a layout of Modification 2 of the power semiconductor module of FIG. 13. A power semiconductor module 42 of FIG. 15 is characterized in that the positive-side switching device 411, the negative-side diode device 422, the positive-side diode device 421, and the negative-side switching device 412 are arrayed not substantially in a row, so that the semiconductor devices are disposed closer to each other. Thus, the power semiconductor module can be further downsized.

Note that the case of FIG. 15 is the same as that of FIG. 13 in that the positive-side diode device 421 and the negative-side diode device 422 are disposed between the positive-side switching device 411 and the negative-side switching device 412. Further, the case of FIG. 15 is also the same as that of FIG. 13 in that the negative-side diode device 422 is disposed closer to the positive-side switching device 411 than the positive-side diode device 421 is, and in that the positive-side diode device 421 is disposed closer to the negative-side switching device 412 than the negative-side diode device 422 is. Therefore, the power semiconductor module 42 of FIG. 15 has substantially the same effects as those of the power semiconductor module 40 of FIG. 13.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

Embodiment 5

FIG. 16 is a schematic plan view that shows a layout of a power semiconductor module according to Embodiment 5.

A power semiconductor module 50 of FIG. 16 is a modification of the power semiconductor module of FIG. 11. Specifically, an insulating substrate 500, a positive-side power-supply terminal 501, an output terminal 502, and a negative-side power-supply terminal 503 of FIG. 16 respectively correspond to the insulating substrate 300, the positive-side power-supply terminal 301, the output terminal 302, and the negative-side power-supply terminal 303 of FIG. 11. A positive-side switching device 511, a negative-side switching device 512, a positive-side diode device 521, and a negative-side diode device 522 of FIG. 16 respectively correspond to the positive-side switching device 311, the negative-side switching device 312, the positive-side diode device 321, and the negative-side diode device 322 of FIG. 11. A positive-side conductive pattern 531, an output-side conductive pattern 532, a negative-side conductive pattern 533, and bonding wires 541-544 as electrical connecting bodies of FIG. 16 respectively correspond to the positive-side conductive pattern 331, the output-side conductive pattern 332, the negative-side conductive pattern 333, and the bonding wires 341-344 of FIG. 11. A control electrode 561 of the positive-side switching device 511 and a control electrode 562 of the negative-side switching device 512 of FIG. 16 respectively correspond to the control electrode 361 of the positive-side switching device 311 and the control electrode 362 of the negative-side switching device 312 of FIG. 11. The corresponding elements are similar in function and configuration, and thus the explanations thereof will not be repeated below.

The power semiconductor module 50 of FIG. 16 is different from the semiconductor module of FIG. 11 in arrangement of the positive-side power-supply terminal 501 and the negative-side power-supply terminal 503. Specifically, when the insulating substrate 500 is viewed in plan view, the positive-side power-supply terminal 501 and the negative-side power-supply terminal 503 are disposed along a reference line RL2, the reference line RL2 extending between the positive-side diode device 521 and the negative-side diode device 522 and being orthogonal to the first reference line RL1. According to such a configuration, the path length (the inductance of the bonding wire) of surge current SG2 at the time of turn-on of the positive-side switching device 511 and the path length (the inductance of the bonding wire) of surge current SG4 at the time of turn-on of the negative-side switching device 512 can be advantageously shortened to an equal extent. Concrete explanations are given below with reference to the paths of surge currents illustrated.

FIG. 17 is a diagram that shows the paths of surge currents in the power semiconductor module of FIG. 16. In FIG. 17, the path of surge current SG2 of FIG. 2 is indicated by a broken line, and the path of surge current SG4 of FIG. 3 is indicated by a dot-and-dash line. As shown in FIG. 17, by placing the positive-side switching device 511 and the negative-side diode device 522 to be adjacent to each other, the path length of surge current SG2 flowing through the positive-side power-supply terminal 501, the positive-side switching device 511, the negative-side diode device 522, and the negative-side power-supply terminal 503 in this order can be shortened. Similarly, by placing the positive-side diode device 521 and the negative-side switching device 512 to be adjacent to each other, the path length of surge current SG4 flowing through the positive-side power-supply terminal 501, the positive-side diode device 521, the negative-side switching device 512, and the negative-side power-supply terminal 503 in this order can be shortened. Further, by placing the positive-side power-supply terminal 501 and the negative-side power-supply terminal 503 along the reference line RL2, the path length of surge current SG2 and the path length of surge current SG4 can be substantially equalized.

According to the above described configuration, a surge voltage at the time of turn-on of the positive-side switching device 511 and a surge voltage at the time of turn-on of the negative-side switching device 512 can be reduced to an equal extent. Accordingly, the losses of the semiconductor switching devices can be equalized and the losses of the diode devices can also be equalized. Therefore, heat-dissipation equipment can be simplified. Further, equalization of reductions in surge voltage leads to equalization of reductions in magnitude of noise current, and thus equipment with excessive reduction in noise can be prevented.

The other effects of FIG. 16 are similar to those of FIG. 11, and thus are summarized as below in brief.

First, since the positive-side switching device 511 and the negative-side diode device 522 are disposed to be adjacent to each other, they can be connected to each other via the shortest bonding wire 541. Since the positive-side diode device 521 and the negative-side switching device 512 are disposed to be adjacent to each other, they can be connected to each other via the shortest bonding wire 543. Since the negative-side switching device 512 and the negative-side conductive pattern 533 are adjacent to each other, they can be connected to each other via the shortest bonding wire 544. Accordingly, reduction in impedance can be achieved, and thus a surge voltage can be reduced.

Since the switching devices, which are the main heat generators, can be disposed at both ends of the array of the semiconductor devices, a thermal interference between the switching devices can be lessened. As a result, heat-dissipation equipment can be simplified.

The bonding wire that connects a positive-side control terminal 551 with the control electrode 561 of the positive-side switching device 511 does not pass over the output-side conductive pattern 532 and the negative-side conductive pattern 533. Similarly, the bonding wire that connects a negative-side control terminal 552 with the control electrode 562 of the negative-side switching device 512 does not pass over the positive-side conductive pattern 531 and the negative-side conductive pattern 533. As a result, the risk of malfunction of the positive-side switching device 511 and the negative-side switching device 512 can be reduced.

By placing the positive-side control terminal 551 and the negative-side control terminal 552 along one side of the insulating substrate 500, the entire power semiconductor module can be downsized.

As described above, according to the present embodiment, a power semiconductor module can be provided that achieves low inductance, simplification of heat-dissipation equipment, reduction in noise, reduction in risk of malfunction, and downsizing.

<Modification of Embodiment 5>

Figure 18:
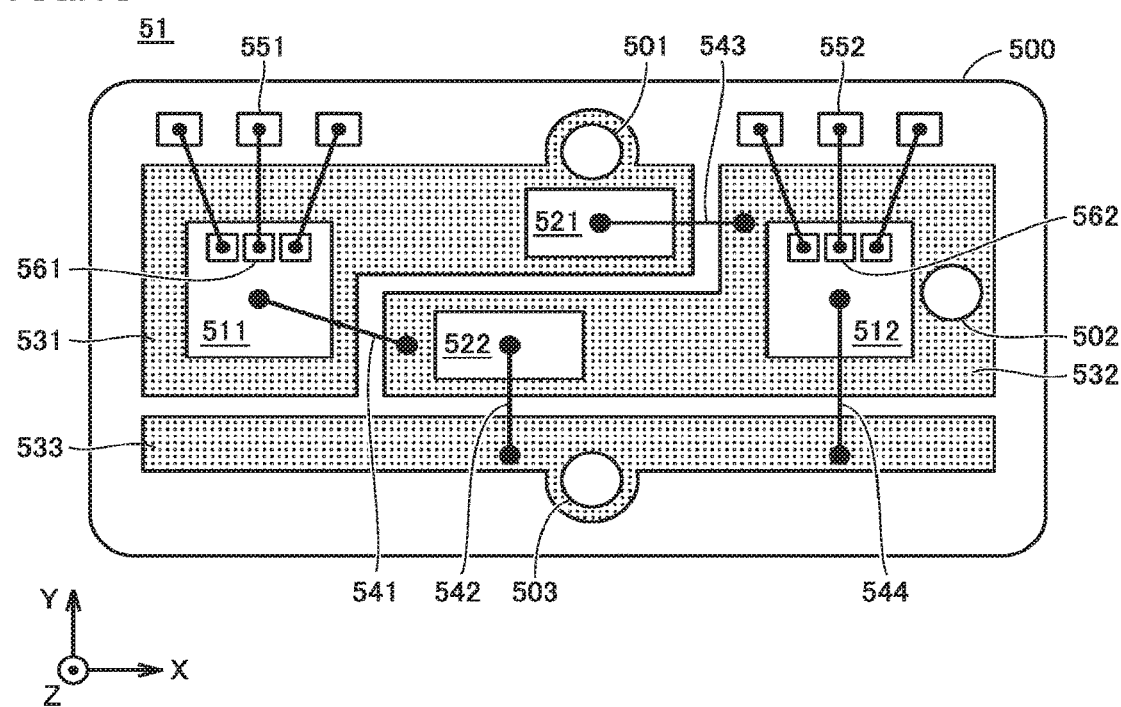
FIG. 18 is a schematic plan view that shows a layout of Modification of the power semiconductor module of FIG. 16.

FIG. 18 is a schematic plan view that shows a layout of Modification of the power semiconductor module of FIG. 16. A power semiconductor module 51 of FIG. 18 is characterized in that the positive-side switching device 511, the negative-side diode device 522, the positive-side diode device 521, and the negative-side switching device 512 are arrayed not substantially in a row, so that the semiconductor devices are disposed closer to each other. Thus, the power semiconductor module can be further downsized.

Note that the case of FIG. 18 is the same as that of FIG. 16 in that the positive-side diode device 521 and the negative-side diode device 522 are disposed between the positive-side switching device 511 and the negative-side switching device 512. Further, the case of FIG. 18 is also the same as that of FIG. 16 in that the negative-side diode device 522 is disposed closer to the positive-side switching device 511 than the positive-side diode device 521 is, and in that the positive-side diode device 521 is disposed closer to the negative-side switching device 512 than the negative-side diode device 522 is. Therefore, the power semiconductor module 51 of FIG. 18 has substantially the same effects as those of the power semiconductor module 50 of FIG. 16.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

Embodiment 6

Figure 19:
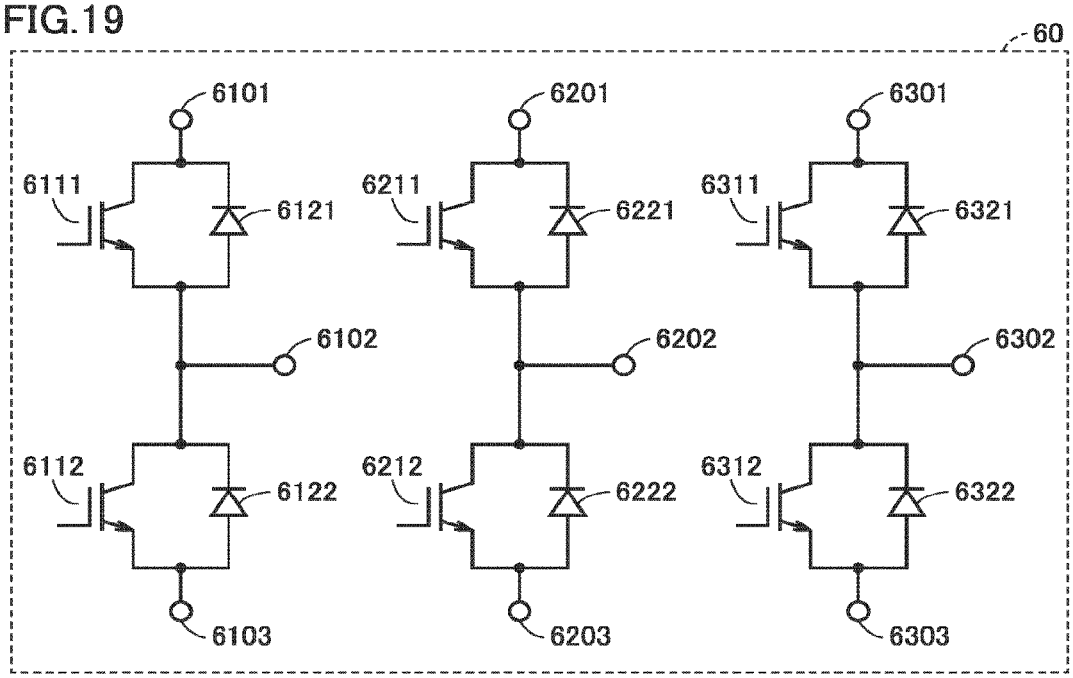
FIG. 19 is a circuit diagram that shows a configuration of a power semiconductor module according to Embodiment 6.

FIG. 19 is a circuit diagram that shows a configuration of a power semiconductor module according to Embodiment 6. With reference to FIG. 19, a power semiconductor module 60 is a three-phase bridge inverter circuit, which is a so-called 6-in-1 structure.

With reference to FIG. 19, the power semiconductor module 60 includes, as components of a circuit for U-phase, a positive-side power-supply terminal 6101, an output terminal 6102, a negative-side power-supply terminal 6103, a positive-side switching device 6111, a positive-side diode device 6121, a negative-side switching device 6112, and a negative-side diode device 6122. The power semiconductor module 60 includes, as components of a circuit for V-phase, a positive-side power-supply terminal 6201, an output terminal 6202, a negative-side power-supply terminal 6203, a positive-side switching device 6211, a positive-side diode device 6221, a negative-side switching device 6212, and a negative-side diode device 6222. The power semiconductor module 60 includes, as components of a circuit for W-phase, a positive-side power-supply terminal 6301, an output terminal 6302, a negative-side power-supply terminal 6303, a positive-side switching device 6311, a positive-side diode device 6321, a negative-side switching device 6312, and a negative-side diode device 6322.

The configuration of the circuit for each phase is the one as described with reference to FIG. 1, and thus the explanations thereof will not be repeated here. The three-phase bridge circuit of FIG. 19 converts DC power input in common between the positive-side power-supply terminals 6101, 6201, 6301 and the negative-side power-supply terminals 6103, 6203, 6303 into three-phase AC power, based on a well-known PWM signal, and outputs the three-phase AC power obtained by the conversion from the output terminals 6102, 6202, 6302 to a load.

Figure 20:
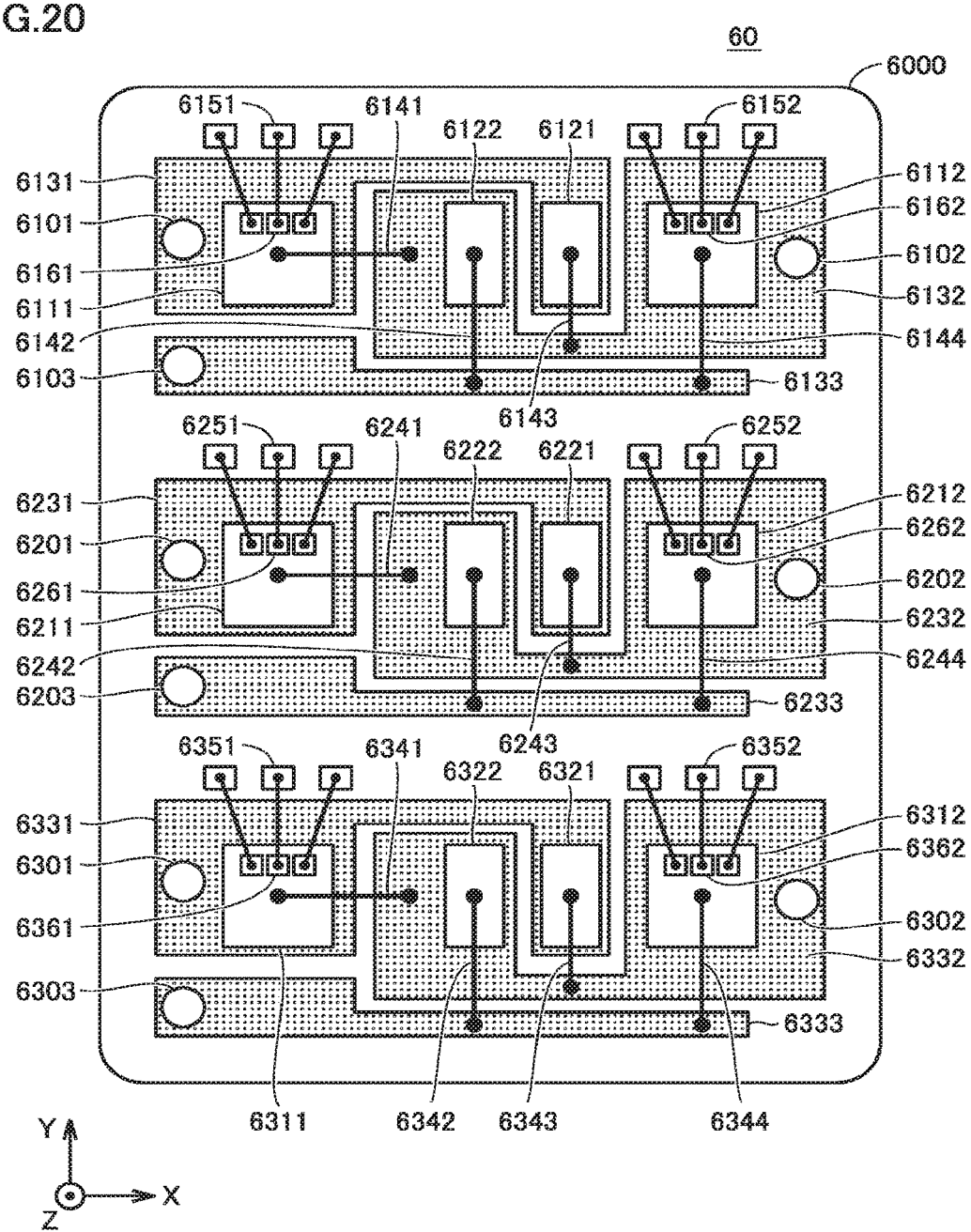
FIG. 20 is a schematic plan view that shows a layout of the power semiconductor module of FIG. 19.

FIG. 20 is a schematic plan view that shows a layout of the power semiconductor module of FIG. 19. The layout diagram of FIG. 20 additionally includes, as components of the circuit for U-phase, a positive-side conductive pattern 6131, an output-side conductive pattern 6132, a negative-side conductive pattern 6133, a positive-side control terminal 6151, a negative-side control terminal 6152, control electrodes 6161, 6162 of the switching devices, and bonding wires 6141-6144 as electrical connecting bodies. The layout diagram of FIG. 20 additionally includes, as components of the circuit for V-phase, a positive-side conductive pattern 6231, an output-side conductive pattern 6232, a negative-side conductive pattern 6233, a positive-side control terminal 6251, a negative-side control terminal 6252, control electrodes 6261, 6262 of the switching devices, and bonding wires 6241-6244 as electrical connecting bodies. The layout diagram of FIG. 20 additionally includes, as components of the circuit for W-phase, a positive-side conductive pattern 6331, an output-side conductive pattern 6332, a negative-side conductive pattern 6333, a positive-side control terminal 6351, a negative-side control terminal 6352, control electrodes 6361, 6362 of the switching devices, and bonding wires 6341-6344 as electrical connecting bodies.

The layout of the circuit for each phase of FIG. 20 is the same as the layout of the power semiconductor module 30 in Embodiment 3 described with reference to FIG. 11, and thus the explanations thereof will not be repeated below. According to the power semiconductor module 60 of FIG. 20, similarly to the case of Embodiment 3, a power semiconductor module can be provided that achieves low inductance, simplification of heat-dissipation equipment, and reduction in risk of malfunction, and whose inductances from the power-supply terminals to the output terminal are equalized.

Note that, although the electrical connecting bodies are illustrated by bonding wires in the present embodiment, the electrical connecting bodies of the present embodiment are not limited to bonding wires. For example, the electrical connecting bodies may be direct lead bonding designed for a high current.

It should be understood that the embodiments disclosed herein are illustrative in every respect, not limitative. It is intended that the scope of the present disclosure is defined not by the above description but by the terms of the claims, and it is intended that any modification within the meaning and scope equivalent to the claims is included.

REFERENCE SIGNS LIST 10, 11, 20, 21, 22, 30, 31, 40, 41, 42, 50, 51, 60: power semiconductor module; 100, 200, 300, 400, 500, 6000: insulating substrate; 101, 201, 301, 401, 501, 6101, 6201, 6301: positive-side power-supply terminal; 102, 202, 302, 402, 502, 6102, 6202, 6302: output terminal; 103, 203, 303, 403, 503, 6103, 6203, 6303: negative-side power-supply terminal; 111, 211, 311, 411, 511, 6111, 6211, 6311: positive-side switching device; 112, 212, 312, 412, 512, 6112, 6212, 6312: negative-side switching device; 121, 221, 321, 421, 521, 6121, 6221, 6321: positive-side diode device; 122, 222, 322, 422, 522, 6122, 6222, 6322: negative-side diode device; 131, 231, 331, 431, 531, 6131, 6231, 6331: positive-side conductive pattern; 132, 232, 332, 432, 532, 6132, 6232, 6332: output-side conductive pattern; 133, 233, 333, 433, 533, 6133, 6233, 6333: negative-side conductive pattern; 141-144, 241-244, 341-344, 441-444, 541-544, 6141-6144, 6241-6244, 6341-6344: bonding wire; 151, 251, 351, 451, 551, 6151, 6251, 6351: positive-side control terminal; 152, 252, 352, 452, 552, 6152, 6252, 6352: negative-side control terminal; 161, 162, 261, 262, 361, 362, 461, 462, 561, 562, 6161, 6162, 6261, 6262, 6361, 6362: control electrode; RL1, RL2: reference line.

The invention claimed is:

1. A power semiconductor module comprising:
an insulating substrate including a first principal surface and a second principal surface;
a positive-side conductive pattern, a negative-side conductive pattern, and an output-side conductive pattern which are formed on the first principal surface of the insulating substrate;
a positive-side power-supply terminal provided on the positive-side conductive pattern and configured to receive a positive-side power-supply voltage;
a negative-side power-supply terminal provided on the negative-side conductive pattern and configured to receive a negative-side power-supply voltage;
an output terminal provided on the output-side conductive pattern and configured to be electrically connected to a load;
a positive-side switching device including:
a first principal surface having a first main electrode formed thereon; and
a second principal surface having a second main electrode and a control electrode formed thereon,
the first main electrode being attached to the positive-side conductive pattern, the second main electrode being connected to the output-side conductive pattern via an electrical connecting body;
a positive-side diode device including:
a first principal surface having a cathode electrode formed thereon; and
a second principal surface having an anode electrode formed thereon,
the cathode electrode being attached to the positive-side conductive pattern, the anode electrode being connected to the output-side conductive pattern via an electrical connecting body;
a negative-side switching device including:
a first principal surface having a first main electrode formed thereon; and
a second principal surface having a second main electrode and a control electrode formed thereon,
the first main electrode being attached to the output-side conductive pattern, the second main electrode being connected to the negative-side conductive pattern via an electrical connecting body; and
a negative-side diode device including:
a first principal surface having a cathode electrode formed thereon; and
a second principal surface having an anode electrode formed thereon,
the cathode electrode being attached to the output-side conductive pattern, the anode electrode being connected to the negative-side conductive pattern via an electrical connecting body,
when the insulating substrate is viewed in plan view, the positive-side diode device and the negative-side diode device being disposed between the positive-side switching device and the negative-side switching device, the negative-side diode device being disposed closer to the positive-side switching device than the positive-side diode device is,
when the insulating substrate is viewed in plan view, the positive-side diode device and the negative-side diode device being disposed on or along a first reference line, the first reference line connecting a location of the positive-side switching device and a location of the negative-side switching device.

2. The power semiconductor module according to claim 1, wherein, when the insulating substrate is viewed in plan view, a part of the output-side conductive pattern is disposed between the positive-side diode device and the negative-side conductive pattern.

3. The power semiconductor module according to claim 1, wherein, when the insulating substrate is viewed in plan view, a part of the positive-side conductive pattern is disposed between the negative-side diode device and the negative-side conductive pattern.

4. The power semiconductor module according to claim 2, wherein
when the insulating substrate is viewed in plan view, the output terminal is disposed opposite to the positive-side switching device across the negative-side switching device,
when the insulating substrate is viewed in plan view, the positive-side power-supply terminal is disposed opposite to the negative-side switching device across the positive-side switching device, and
when the insulating substrate is viewed in plan view, the negative-side power-supply terminal is disposed to be adjacent to the positive-side power-supply terminal and to be remoter from the output terminal than the positive-side switching device is.

5. The power semiconductor module according to claim 3, wherein
when the insulating substrate is viewed in plan view, the positive-side power-supply terminal and the negative-side power-supply terminal are disposed on a side opposite to the output terminal with respect to the first reference line,
when the insulating substrate is viewed in plan view, the positive-side power-supply terminal is disposed to be adjacent to the positive-side switching device and to be remoter from the first reference line than the positive-side switching device is, and
when the insulating substrate is viewed in plan view, the negative-side power-supply terminal is disposed to be adjacent to the negative-side switching device and to be remoter from the first reference line than the negative-side switching device is.

6. The power semiconductor module according to claim 2, wherein, when the insulating substrate is viewed in plan view, the positive-side power-supply terminal and the negative-side power-supply terminal are disposed along a second reference line, the second reference line extending between the positive-side diode device and the negative-side diode device and being orthogonal to the first reference line.

7. The power semiconductor module according to claim 1, the power semiconductor module further comprising:
a positive-side control terminal formed on the insulating substrate and connected to the control electrode of the positive-side switching device via an electrical connecting body; and
a negative-side control terminal formed on the insulating substrate and connected to the control electrode of the negative-side switching device via an electrical connecting body, wherein
when the insulating substrate is viewed in plan view, the electrical connecting body connecting the control electrode of the positive-side switching device with the positive-side control terminal does not cross over the negative-side conductive pattern and the output-side conductive pattern, and
when the insulating substrate is viewed in plan view, the electrical connecting body connecting the control electrode of the negative-side switching device with the negative-side control terminal does not cross over the positive-side conductive pattern and the output-side conductive pattern.

8. The power semiconductor module according to claim 7, wherein
when the insulating substrate is viewed in plan view,
the positive-side control terminal and the negative-side control terminal are disposed on the same side with respect to the first reference line,
the positive-side control terminal is disposed to be adjacent to the positive-side conductive pattern and to be remoter from the first reference line than the positive-side conductive pattern is, and
the negative-side control terminal is disposed to be adjacent to the output-side conductive pattern and to be remoter from the first reference line than the output-side conductive pattern is.

* * * * *